(12) United States Patent
Hurwitz et al.

(10) Patent No.: US 10,998,914 B2
(45) Date of Patent: May 4, 2021

(54) MULTI-STAGE CONVERSION ANALOG-TO-DIGITAL CONVERTER

(71) Applicant: Analog Devices International Unlimited Company, Limerick (IE)

(72) Inventors: Jonathan Ephraim David Hurwitz, Edinburgh (GB); Edward Chapin Guthrie, Charlestown, MA (US); Joseph Leandro Balais Peje, Manila (PH)

(73) Assignee: Analog Devices International Unlimited Company, Limerick (IE)

( * ) Notice: Subject to any disclaimer, the term of this patent is extended or adjusted under 35 U.S.C. 154(b) by 240 days.

(21) Appl. No.: 16/192,400

(22) Filed: Nov. 15, 2018

(65) Prior Publication Data
US 2019/0115931 A1   Apr. 18, 2019

Related U.S. Application Data

(63) Continuation-in-part of application No. PCT/EP2017/064326, filed on Jun. 12, 2017.
(Continued)

(51) Int. Cl.
*H03M 1/46* (2006.01)
*H04N 5/378* (2011.01)
*H03M 1/56* (2006.01)
*H03M 1/12* (2006.01)
*H03M 1/14* (2006.01)
*H04N 5/357* (2011.01)

(52) U.S. Cl.
CPC ........... *H03M 1/466* (2013.01); *H03M 1/123* (2013.01); *H03M 1/1295* (2013.01); *H03M 1/145* (2013.01); *H03M 1/56* (2013.01); *H04N 5/3575* (2013.01); *H04N 5/378* (2013.01)

(58) Field of Classification Search
CPC .... H03M 1/466; H03M 1/1295; H03M 1/145; H03M 1/123; H03M 1/56; H04N 5/3575; H04N 5/378
USPC ......................................... 341/126, 155, 172
See application file for complete search history.

(56) References Cited

U.S. PATENT DOCUMENTS 6,433,727 B1   8/2002   Yoshinaga
6,670,904 B1   12/2003  Yakovlev
(Continued)

FOREIGN PATENT DOCUMENTS

CN   107196657 A   9/2017
EP   2421155       2/2012
WO   WO-2017212075 A2   1/2018

OTHER PUBLICATIONS

Chao, An-Sheng, et al., "A capacitance-ratio quantification design for linearity test in differential top-plate sampling sar ADCS", Int. J. Circ. Theor. Appl. (2014), (Jul. 15, 2014).
(Continued)

*Primary Examiner* — Khai M Nguyen
(74) *Attorney, Agent, or Firm* — Schwegman Lundberg & Woessner, P.A.

(57) ABSTRACT

An ADC circuit that can resolve the most significant bits (MSBs) using a first circuit during a first stage of a multi-stage conversion and resolve the least significant bits (LSBs) using a second circuit during a second stage of the multi-stage conversion. This can be used, for example, in massively parallel applications where the reference level generation can be shared between thousands of converters.

23 Claims, 13 Drawing Sheets

Related U.S. Application Data

(60) Provisional application No. 62/348,800, filed on Jun. 10, 2016, provisional application No. 62/595,371, filed on Dec. 6, 2017.

(56) References Cited

U.S. PATENT DOCUMENTS

| | | | |
|---|---|---|---|
| 7,199,745 | B2 | 4/2007 | Tachibana et al. |
| 7,812,757 | B1 | 10/2010 | Wong et al. |
| 7,880,779 | B2 * | 2/2011 | Storm .................. H04N 5/3598 348/241 |
| 8,492,697 | B2 | 7/2013 | Neubauer et al. |
| 8,581,761 | B1 | 11/2013 | Bahukhandi et al. |
| 8,933,385 | B2 | 1/2015 | Wang et al. |
| 9,385,735 | B2 * | 7/2016 | Chou .................... H04N 5/378 |
| 9,432,040 | B2 | 8/2016 | Gou et al. |
| 9,450,596 | B2 | 9/2016 | Kim et al. |
| 9,548,755 | B2 | 1/2017 | Huang et al. |
| 9,667,899 | B2 | 5/2017 | Gou et al. |
| 9,847,790 | B2 | 12/2017 | Liu |
| 2015/0008308 | A1 | 1/2015 | Huang et al. |

OTHER PUBLICATIONS

Chen, Denis G., et al., "A 12 pJ/Pixel Analog-to-Information Converter Based 816×640 Pixel CMOS Image Sensor", IEEE Journal of Solid-State Circuits, vol. 49, No. 5, [Online]. Retrieved from the Internet: <URL: http://ieeexplore.ieee.org/stamp/stamp.jsp?tp=&arnumber=6762815&isnumber=6803076, (May 2014), 1210-1222.

Findlater, Keith, et al., "SXGA Pinned Photodiode CMOS Image Sensor in 0.35 μm Technology", 2003 IEEE International Solid-State Circuits Conference, (2003), 10 pgs.

Kim, Min-Kyu, et al., "An Area-Efficient and Low-Power 12-b SAR/Single-Slope ADC Without Calibration Method for CMOS Image Sensors", IEEE Transactions on Electron Devices, vol. 63, No. 9, [Online]. Retrieved from the Internet: <URL: http://ieeexplore.ieee.org/stamp/stamp.jsp?tp=&arnumber=7515162&isnumber=7548080, (Sep. 2016), 3599-3604.

Snoeij, Martijn F., et al., "Multiple-Ramp Column-Parallel ADC Architectures for CMOS Image Sensors", IEEE Journal of Solid-State Circuits, vol. 42, No. 12, (Dec. 2007), 2968-2977.

Tang, Fang, et al., "Low-Power CMOS Image Sensor Based on Column-Parallel Single-Slope/SAR Quantization Scheme", IEEE Transactions on Electron Devices, vol. 60, No. 8, Aug. 2013, (Aug. 2013), 2561-2566.

Tang, Fang, et al., "Single Slope/SAR Column-parallel ADC With Mixed-Signal Error Correction", IEEE Xplore Digital Library, (2013), 237-240.

Tang, Fang, et al., "Two-Step Single Slope/SAR ADC with Error Correction for CMOS Image Sensor", The ScientificWorld Journal, vol. 214, Article ID 861278, (2014), 6 pgs.

"European Application Serial No. 18210552.8, Extended European Search Report dated Apr. 10, 2019", 12 pgs.

Lee, Junan, "High Frame-Rate VGA CMOS Image Sensor Using Non-Memory Capacitor Two-Step Single-Slope ADCs", IEEE Transactions on Circuits and Systems-1: Regular Papers, 62(9), (Sep. 2015), 2147-2155.

* cited by examiner

MULTI-STAGE CONVERSION ANALOG-TO-DIGITAL CONVERTER

CLAIM OF PRIORITY

The present application is a continuation-in-part under 35 U.S.C. § 111(a) of International Patent Application Number PCT/EP2017/064326, titled "CMOS IMAGE SENSORS WITH REDUCED POWER CONSUMPTION", to Jonathan Ephraim David Hurwitz et al., tiled on Jun. 12, 2017 and published on Dec. 14, 2017 as WO2017212075, the entire contents of which being incorporated herein by reference and the benefit of priority of which being hereby claimed. International Patent Application Number PCT/EP2017/064326 claims the benefit of priority of U.S. Provisional Patent Application Ser. No. 62/348,800, titled "CMOS IMAGE SENSOR WITH REDUCED POWER CONSUMPTION", to Jonathan Ephraim David Hurwitz et al., and filed Jun. 10, 2016, the entire contents of which being incorporated herein by reference and the benefit of priority of which is hereby claimed. The present application also claims the benefit of priority of U.S. Provisional Patent Application Ser. No. 62/595,371, titled "SUB-RANGING SAR/SINGLE-SLOPE ANALOG-TO-DIGITAL CONVERTER" to Jonathan Ephraim David Hurwitz et al., filed on Dec. 6, 2017, the entire contents of which being incorporated herein by reference.

FIELD OF THE DISCLOSURE

This document pertains generally, but not by way of limitation, to integrated circuits, and more particularly, to analog to digital converter circuits and systems.

BACKGROUND

In many electronics applications, an analog input signal is converted to a digital output signal (e.g., for further digital signal processing). For instance, a typical complementary metal-oxide-semiconductor (CMOS) image sensor (CIS) may be composed of an array of four transistor (4T) pixels. These pixels share a readout line which is common to a column of pixels. The voltage on this line can be amplified through a programmable gain amplifier (PGA) and then converted to digital by an analog-to-digital converter (ADC) circuit.

CMOS image sensors are used most commonly in cell phone cameras, web cameras, most digital pocket cameras since 2010, and in most digital single-lens reflex cameras. Such image sensors have emerged as an alternative to charge-coupled device (CCD) image sensors because, compared to CCDs, they generally consume less power, have less image lag, and require less specialized manufacturing facilities. In addition, unlike CCDs, CMOS image sensors can combine the image sensor function and image processing functions within the same integrated circuit.

SUMMARY OF THE DISCLOSURE

This disclosure describes, among other things, an ADC circuit that can resolve the most significant bits (MSBs) using a first circuit, e.g., SAR ADC circuit or a single-slope ADC circuit, during a first stage of a multi-stage conversion and resolve the least significant bits (LSBs) using a second circuit, e.g., a single-slope ADC circuit, during a second stage of the multi-stage conversion. This can be used, for example, in massively parallel applications (such as image sensors) where the SAR reference level generation and single-slope ramp generation can be shared between thousands of converters.

In some aspects, this disclosure is directed to a method of operating a sensor circuit having a conversion circuit for performing a multi-stage conversion of a difference of two signals. The method comprises receiving a first output voltage of the sensor circuit on a top plate of a first sampling capacitor of the conversion circuit, receiving a second output voltage of the sensor circuit on a top plate of a second sampling capacitor of the conversion circuit, during a first stage of the multi-stage conversion, adjusting a first voltage on the bottom plate of either the first sampling capacitor or the second sampling capacitor using a first circuit of the conversion circuit, during a second stage of the multi-stage conversion, adjusting a second voltage on the bottom plate of the other of the first sampling capacitor or the second sampling capacitor using a second circuit of the conversion circuit, and converting a difference between the first output voltage and the second output voltage by comparing the first and second output voltages on the top plates of the first and second sampling capacitors in each of the first and second stages.

In some aspects, this disclosure is directed to a circuit for performing a multi-stage conversion of a difference between two signals from a sensor circuit. The circuit comprises a conversion circuit configured to be coupled to an output of the sensor circuit, the conversion circuit comprising a first sampling capacitor having top and bottom plates, wherein the top plate of the first sampling capacitor is configured to receive a first output voltage of the sensor circuit, a second sampling capacitor having top and bottom plates, wherein the top plate of the second sampling capacitor is configured to receive a second output voltage of the sensor circuit, a first circuit configured to adjust a first voltage on the bottom plate of the either the first sampling capacitor or the second sampling capacitor during a first stage of the multi-stage conversion, and a second circuit configured to adjust a second voltage on the bottom plate of the other of the first sampling capacitor or the second sampling capacitor during a second stage of the multi-stage conversion, wherein the conversion circuit is configured to convert a difference between the first output signal and the second output signal by comparing the first and second output voltages on the top plates of the first and second sampling capacitors.

In some aspects, this disclosure is directed to a circuit for performing a multi-stage conversion of a difference between two signals from a sensor circuit. The circuit comprises means for receiving a first output voltage of the sensor circuit on a top plate of a first sampling capacitor of the conversion circuit, means for receiving a second output voltage of the sensor circuit on a top plate of a second sampling capacitor of the conversion circuit, during a first stage of the multi-stage conversion, means for adjusting a first voltage on the bottom plate of either the first sampling capacitor or the second sampling capacitor using a first circuit of the conversion circuit, during a second stage of the multi-stage conversion, means for adjusting a second voltage on the bottom plate of the other of the first sampling capacitor or the second sampling capacitor using a second circuit of the conversion circuit, and means for converting a difference between the first output voltage and the second output voltage by comparing the first and second output voltages on the top plates of the first and second sampling capacitors in each of the first and second stages.

This overview is intended to provide an overview of subject matter of the present patent application. It is not intended to provide an exclusive or exhaustive explanation of the inventive subject matter. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
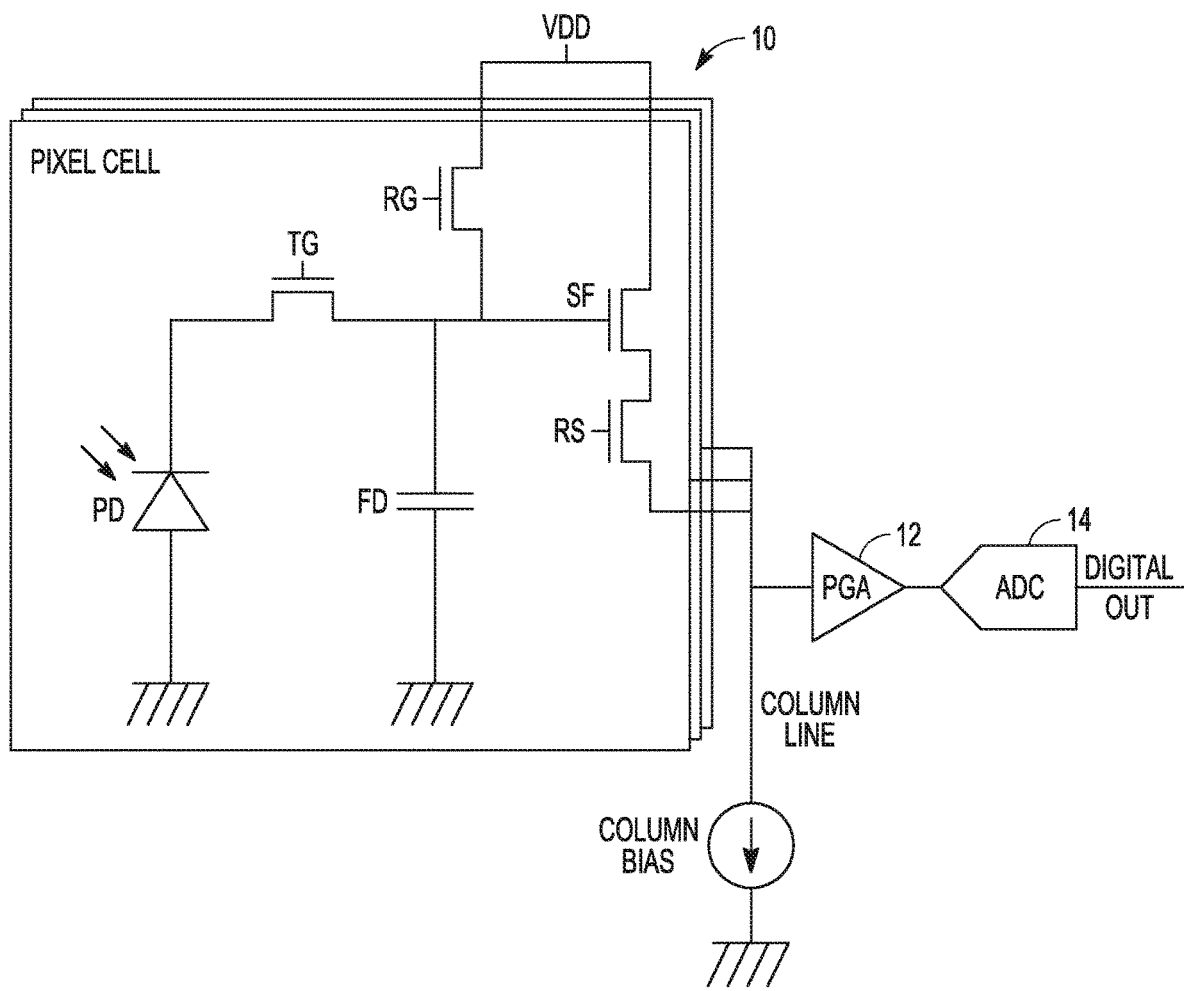
FIG. 1 depicts an example of a complementary metal-oxide-semiconductor (CMOS) image sensor (CIS) column structure.

A single-slope analog-to-digital converter (ADC) circuit can include a ramp generator (e.g., a current source and a capacitor), a comparator, and a timer. The single-slope ADC is simple and accurate, but can take $2^N$ cycles to complete. That is, for an N bit conversion, the input is compared to the ramp $2^N$ times. As an example, a 14-bit single-slope ADC would take 16384 cycles to complete. To perform a conversion in microseconds, a clock speed of over 100 megahertz (MHz) may be needed. Advantageously, slope ADCs can be low power and have a low noise bandwidth.

A successive approximation register (SAR) ADC converts an analog signal to a digital word in a successive approximation manner using a binary search. A SAR ADC circuit can carry out bit trials to compare portions of the analog signal to a reference voltage to determine the digital bit values of a digital word representing a particular sample of the analog signal. A SAR ADC can use, for example, a capacitor array of a digital-to-analog converter (DAC) circuit for carrying out the bit trials for determining the respective digital bit values of the digital word.

A traditional SAR ADC determines the most significant bit (MSB) first, followed by the MSB-1 bit, the MSB-2 bit, until the least significant bit (LSB). The SAR ADC is more complicated and less accurate than the single-slope ADC, but much faster than a single-slope ADC. For an N-bit word, the traditional SAR ADC approach uses N bit trial cycles of a digital-to-analog converter (DAC) circuit to determine the N bits. As an example, a 14-bit SAR ADC would take 14 cycles to complete. Thus, the SAR ADC approach can generate a result in fewer cycles than the slope ADC approach.

The present inventors have recognized the desirability of combining the advantages of the SAR ADC circuit, including the low number of cycles needed for a conversion and the advantages of the slope ADC circuit, including the low power, low bandwidth comparator.

This disclosure describes, among other things, an ADC circuit that can resolve the MSBs using a first circuit, e.g., SAR ADC circuit or a single-slope ADC circuit, during a first stage of a multi-stage conversion and resolve the LSBs using a second circuit, e.g., a single-slope ADC circuit, during a second stage of the multi-stage conversion. This can be used, for example, in massively parallel applications (such as image sensors) where the SAR reference level generation and single-slope ramp generation can be shared between thousands of converters. This has the advantage of the parallel nature of the single-slope converter enhanced by the speed of a SAR. In some implementations, the SAR/single-slope techniques of this disclosure can be used in conjunction with complementary metal-oxide-semiconductor (CMOS) image sensors (CIS).

CIS uses photodiodes that "react" to different frequencies of light (usually visible light), using the photons acquired to generate a flow of electrons which get accumulated into a signal dependent charge by integrating over time. This "reaction" can be sampled and converted into data using ADC circuits. The data can be stored in a memory and then read out by, for example, a processor of a camera.

FIG. 1 depicts an example of a complementary metal-oxide-semiconductor (CMOS) image sensor (CIS) column structure. The CIS 10 of FIG. 1 can include an array of four transistor (4T) pixels, for example, although the techniques of this disclosure are not limited to a 4T pixel and are generally applicable to other arrangements such as a 1.75T pixel. These pixels share a readout line which is common to a column of pixels. In some example configurations, the voltage on this line can be amplified through a programmable gain amplifier (PGA) 12 and then converted to digital by an ADC circuit (or "ADC") 14. The purpose of the PGA is to amplify the signal before it is converted by the ADC. FIG. 1 shows this basic structure. This structure can be repeated for each column of pixels in the image sensor.

A typical CMOS image sensor may be composed of an array of pixel cells, arranged in rows and columns. CMOS image sensor operation may be viewed as having three phases of operation: reset, exposure, and readout. Reset may be viewed as the first phase, where, before a pixel cell is exposed to light, the photodiode of the pixel cell may be cleared of existing charge. Exposure may be viewed as the next phase, where the photodiode is exposed to light and accumulates charge as a result of photons being incident on the photosensitive area of the photodiode. Readout may be viewed as the last phase, where the charge accumulated during the exposure is read out, by converting the charge to a voltage at the input of an amplifier (source follower) and using a column line associated with (i.e. addressing) the pixel cell, to connect the pixel to imager readout. In order to control operation of a pixel cell through these phases, each pixel cell may include four transistors—a row select (RS) transistor, a reset gate (RG) transistor, a source follower (SF) transistor, and a transfer gate (TG) transistor (such pixel cells may, therefore, be referred to as four-transistor (4T) pixels).

The node at the input to the source follower is commonly referred to as the floating diffusion, the capacitance at this node effectively converts the charge in the photodiode to a voltage when transferred. There are several variations of pixels which share the source follower, reset and row select transistors with multiple pixels, were each pixel has a unique transfer gate and photodiode, which connect together at the gate of the source follower, for example a pixel which shares its source follower with one other pixel has a total of 5 transistors between 2 pixels, with therefore an average of 2.5 transistors per pixel and is often therefore referred to as a 2.5T pixel. Pixels can be split for phase detection for focus detection and have 2 readouts per pixel. Pixels can have other forms of amplifiers, or functions such as demodulation for depth measurement or overflow control for high dynamic range. This invention can be applied to the readout of any configuration of pixel were two or more values need to be differenced in order to remove noise or create a difference. This invention can be applied to other applications were two values need to be differenced.

Commonly, these pixel cells arranged in a given column of the array of pixel cells share a common column readout line for their readout which is common to a column of pixels. Arrays can also be linear. The voltage read out on a given column line can be amplified through a programmable gain amplifier (PGA) and then converted to digital values by an analog to digital converter (ADC). The purpose of the PGA is to amplify the signal before it is converted by the ADC. FIG. 1 shows this basic structure. Such a structure may be repeated for each column of pixel cells in an image sensor.

In the pixel cell, light is converted to charge in the photodiode (PD). To read this charge out cleanly a correlated double sample (CDS) operation is performed, in order to minimize the noise contribution of the floating diffusion and the source follower. The floating diffusion is reset and read before charge is transferred to it and then read again afterwards, the difference removes the noise contribution of the floating diffusion and the offset of the source follower. This may be done in the analog domain before the ADC in the PGA or by a designated correlated double sampling (CDS) unit configured to remove reset offset and noise and therefore improve dynamic range. This correlated double sampling can also be done partly in the digital domain after analog to digital conversion. The operation of the pixel to perform CDS is explained further, but in essence is the act of measuring the pixel twice: once when it contains the reset value and once when it contains the signal value.

First, the row select (RS) transistor is turned on to connect this pixel to the shared column line. The reset gate (RG) transistor is pulsed to clear any accumulated charge off of the floating diffusion (FD) by connecting it to a reset voltage, the act of releasing the reset gate leaves behind some charge injection and KTC noise on the floating diffusion. This reset voltage ($V_{rst}$) on the FD is driven onto the column line through the source follower (SF) transistor. This voltage is amplified by the programmable gain amplifier (PGA) and then converted to a digital output signal with the analog-to-digital converter (ADC).

Next, the transfer gate (TG) is pulsed to transfer the accumulated charge from the PD to the FD. The new voltage on the FD (the signal voltage, $V_{data}$) is converted to a digital signal in the manner similar to $V_{rst}$. The two digitized results are subtracted from each other to produce the final result and more particularly to also cancel common sources (such as the source follower threshold voltage and the KTC noise left on the FD) that would produce an error in the signal path. Finally, RS is turned off to disconnect this row from the column line, allowing the next row to be accessed.

It should be noted that the techniques of this disclosure are not limited to a 4T pixel and are generally applicable to other arrangements such as a 1.75T pixel, which has 4PDs, 4TX and then shares 1RG, 1SF and 1 RS.

The values sampled by the ADC will not be equal to, but will follow, the $V_{rst}$ and $V_{data}$ voltages present on the FD. For the purpose of describing the operation of the invention, $V_{rst}$ and $V_{data}$ will be used as the nomenclature for the two values that are to be read into the invention. In practice, the techniques described in this disclosure could be generally applied to the difference of any two voltages.

As described in detail below, using various techniques of this disclosure, the ADC circuit 14 can resolve the MSBs using a SAR ADC and the LSBs using a single-slope ADC. In this manner, the ADC circuit 14 can utilize the advantages of the SAR ADC circuit, including the low number of cycles needed for a conversion and the advantages of the slope ADC circuit, including the low power, low bandwidth comparator.

Figure 2:
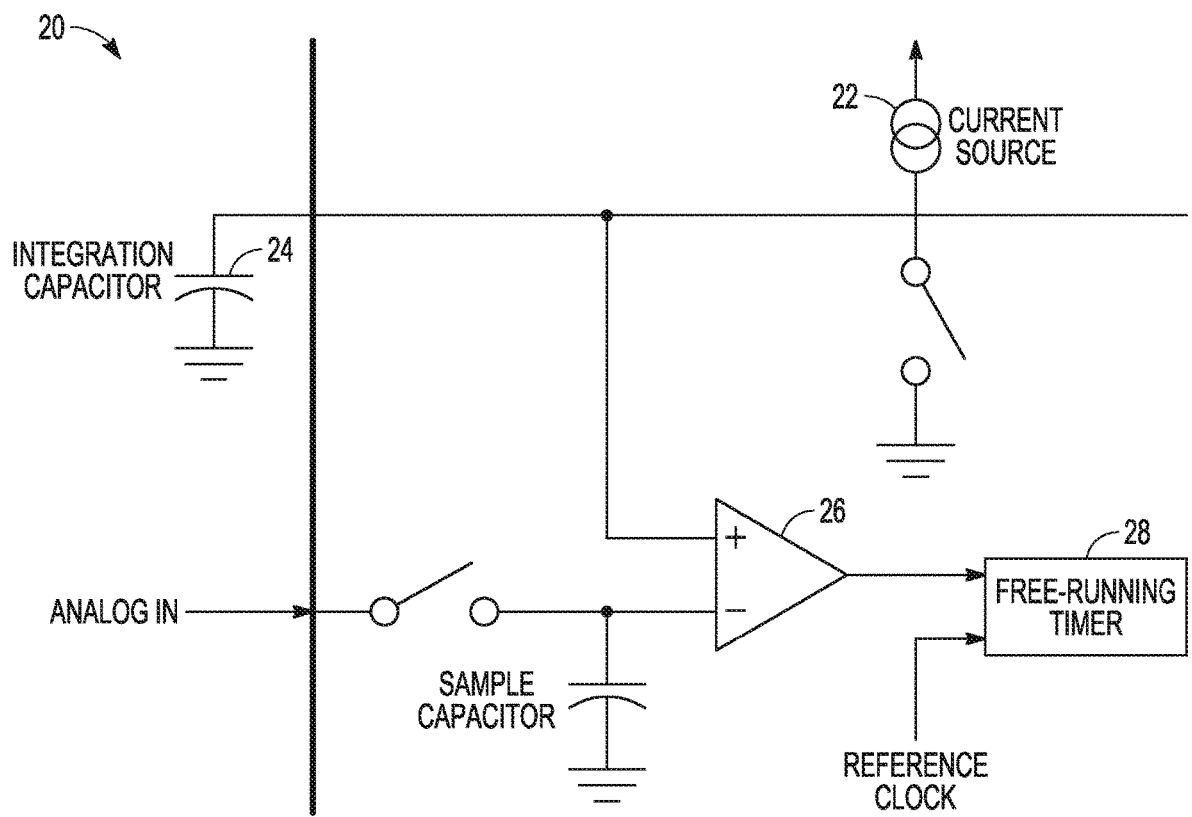
FIG. 2 depicts an example of a single-slope ADC circuit.

FIG. 2 depicts an example of a single-slope ADC circuit. The slope ADC circuit 20 of FIG. 2 can include a ramp generator (e.g., a current source 22 and a capacitor 24), a comparator 26, and a timer 28. The ramp generator can be shared between all of the ADCs in the CIS, meaning that each ADC only needs a dedicated comparator 26 and timer 28. Often the timer is also shared between multiple columns by having one central counter and distributing a digital bus containing this time, so that all that is needed in each column is latch that stores the value on the bus when the comparator fires.

For an N bit conversion, the input is compared to the ramp $2^N$ times. If digital correlated double sampling is needed, this conversion is performed twice in an imaging application, once for $V_{rst}$ and once for $V_{data}$. Time can be saved for the $V_{rst}$ conversion since that level does not vary much so the ramp does not need to span the whole ADC input range.

Alternatively analog correlated double sampling can be performed either as part of a programmable gain amplifier prior to digitization, or as part of the sampling capacitor and comparator structure of the ADC. In this later case, an approach is to sample the reset level on one capacitor and sample the signal level on another capacitor and then ramp a first plate (or "bottom" plate) of the signal capacitor until its top plate crosses a voltage on a second plate (or "top" plate) of the reset capacitor. In this case, only ramping the bottom plate of one capacitor is used to find the value of the signal.

An additional advantage of the single-slope converter is that the comparator need not have a low hysteresis or be high speed as a delayed decision translates into an offset error which can be corrected with calibration.

The single-slope ADC 20 is relatively slow since it must do a linear search through the input range to find the answer. Attempts have been made to use a non-linear slope or multiple lower resolution slopes with different rates of change to try to address this issue, but these techniques suffer from irregular quantization noise and errors matching the different slopes, and as such have been limited in the precision and speed-up factor they can achieve.

In a SAR ADC circuit, an output voltage of a DAC circuit is compared to a sampled-and-held voltage using a comparator circuit. The bit values of the DAC circuit can be adjusted based on the output of the comparator circuit. The comparator circuit determines whether the DAC output is greater or less than the sampled input voltage and the result is stored as a one or zero for that bit of the DAC. Conversion then proceeds to the next bit value until all bits of the digital value are determined. One iteration of changing the DAC output and comparing the voltage to the sampled input can be referred to as a bit trial. SAR logic circuitry controls the ADC circuit operation during the bit trials. When the bit trials are complete, the digital value of the sampled and held voltage is available at the DAC input and an analog approximation of that value is available at the DAC output.

Unlike the bottom plate driving scheme utilized in this disclosure and described below, many SAR ADC implementations utilize one or more switched capacitor DAC (CDAC) arrays. Each CDAC includes a plurality of capacitors, each capacitor having first and second plates. Each of the capacitors of the CDAC array has an associated switch that is operable to selectively connect a first plate, e.g., the lowermost or "bottom" plate, to either a first positive reference voltage or to the second negative (or ground) reference voltage, depending on the bit trial result. In some implementations, the basic SAR algorithm can involve a "Guess—>Decide—>Set" manner in switching bit trial capacitors. Each bit can be "set", e.g., connected to the positive reference voltage at the start of that particular bit trial, and based on the bit trial output, that bit setting can be kept or "reset", e.g., connected to the second reference voltage, e.g., ground.

This disclosure describes a sub-ranging ADC circuit that can perform a search in multiple stages by resolving the MSBs using a SAR ADC circuit and the LSBs using a single-slope ADC circuit. The reset ($V_{rst}$) and data ($V_{data}$) levels can be sampled onto the top plates of separate sampling capacitors $C_{blk}$ and $C_{wht}$, respectfully. The bottom plates of these capacitors $C_{wht}$ and $C_{blk}$ can be driven with multiple reference voltage levels, thereby moving the top plate voltages, which can be compared to each other.

In some example configurations, as shown and described in detail below with respect to FIGS. 3-9, during the first stage of conversion, the bottom plate of $C_{wht}$ is driven to N different levels using a binary search algorithm. This algorithm forces the inputs of the comparator ("pos" and "neg") together to within the full scale voltage divided by $2^N$. In this implementation, each converter has an N-bit SAR switch array to select from $2^N$ reference voltage levels, which are common to all of the converters.

During the second stage, the voltage on $C_{wht}$ is held and a single-slope ramp is applied to the bottom plate of $C_{blk}$. With this algorithm, the ramp does not have to span the full scale range and could therefore be $2^N$ times smaller. However, in practice it can span more than that range (e.g., double, but other factors are possible) to provide over and under ranging redundancy so that the first stage conversion does not have to be perfect as long as the level that is being held on the bottom plate of $C_{wht}$ is stable and the voltage on the other-end of $C_{wht}$ is within the range of voltages that the other-end of $C_{blk}$ sweeps between.

The resolution of the slope ADC stage of conversion should reflect this span, so in the case of double the span, one more bit of resolution may be needed in this conversion stage. To help ensure this condition, an offset can be applied during the first stage conversion by moving the bottom plate of $C_{blk}$ while performing the SAR conversion, to create a known error in the SAR convergence. At the end of the conversion, the SAR result is combined with the single-slope count to produce a digital representation of the pixel voltage.

This combination can take in to account any offset between the first and second conversion stages, whether deliberately included or as a result of offset or bandwidth of the comparator. As the sub-ranging which occurs as a result of the first conversion is based on a series capacitor which will share its charge with any parasitic capacitance on node "pos", the combination of MSB and LSB conversions can take into account this error by providing a correction factor which is a function of the signal. This correction factor can be linear or non-linear to accommodate different charge sharing mechanisms.

In the SAR ADC first stage of conversion, each ADC of the CIS switches between multiple reference levels, so any parasitic charge on the $C_{wht}$ capacitor or from the comparator when it switches that comes through $C_{wht}$ needs to be charged by the reference. This parasitic charge is potentially signal dependent and different for each ADC that shares the common reference lines and can lead to a crosstalk mechanism. To minimize this error, a settling period can be included in the timing, to ensure that the level is correct when the slope phase begins.

In addition for the top K bits of the SAR conversion stage, additional separate "dirty" references can be used, so that the majority of charging current is supplied by these references and not from the final M bits of "clean" references. Once the top K bits have been resolved, the switches can disconnect from the dirty references and connect to the equivalent clean reference lines. Since these two voltages are nominally the same the clean lines will experience minimal load that is not data dependent. This can reduce the charge that needs to be absorbed by the accurate reference levels by $2^K$.

In order to minimize the offset of the comparator, which helps minimize the required voltage span for the second phase, the comparator can be auto zeroed while acquiring the $V_{rst}$ sample. However it may be advantageous to disconnect the comparator from the sample capacitors while auto zeroing, and only attach them after both $C_{blk}$ and $C_{wht}$ have been sampled. This is because the comparator can have a non-linear input charge that is a function of its state, and if this is attached to $C_{wht}$ while the signal is being sampled it can result in an error. An alternative is to disconnect the comparator while sampling both $V_{rst}$ and $V_{data}$, and auto-zero it using a voltage close to $V_{rst}$, and re-attach the comparator before entering the first conversion stage. In this way the charge shared with the storage caps is the charge of the comparator in a known state.

In the example shown in FIG. 1 of the ADC attached to a 4T pinned photodiode, the first voltage measured can be the reset level, the second level measured after the transfer gate is pulsed can be the data level, and because charge transferred from the pixel lowers the floating diffusion, it can be lower than the reset level. In the first phase of conversion, either the bottom plate of the $C_{wht}$ capacitor or the $C_{blk}$ capacitor can be moved, but by altering the $C_{wht}$ capacitor, the voltage at which the comparator fires can be close (e.g., within 1 MSB) of the reset level (e.g., ±0.5 MSB). In this example, the second phase of conversion ramps the bottom plate of the $C_{blk}$ capacitor to perform the LSB conversion, which can then approximately the reset level. This configuration can be advantageous as the point at which the comparator fires is only dependent on the reset level so the common mode is more deterministic than an alternative configuration, which is to alter the bottom plate of the $C_{blk}$ capacitor during the first phase of conversion and the $C_{wht}$ capacitor in the second phase of the conversion. Although the two configurations can perform an equivalent function, in the configuration in which the bottom plate of the $C_{blk}$ capacitor is altered during the first phase of conversion and the $C_{wht}$ capacitor is altered in the second phase of the conversion, the point at which the comparator fires can track the value of the data signal and can require the comparator to have a wider input range and can introduce other issues.

It should be noted there can be cases where the first sample can be the data level of the sensor and the second level can be the reset level, such as in a 3T non-pinned photodiode pixel. In this case, the first capacitor sampled would contain the data, and the second capacitor the reset level and, as before, because the data would be lower than the reset, would similarly benefit from being moved in the first phase of conversion to convert the MSB and then move the second capacitor in the second phase of conversion to convert the LSB. It is therefore possible to move either the first or second capacitor in the first phase of conversion, and move the other capacitor one of the first and second capacitor in the second phase, while holding the drive used on the capacitor used in the first phase.

For clarification, it should be noted that the two voltages being differenced by the ADC may originate from the same sensor element or from different sensor elements of the same type, or from different sensor elements of different types. Correlated double sampling readout of a pinned photodiode with a floating diffusion such as a 4T, 2.5T, 1.75T or 1.5T pixel, is only one example of the first type of differencing from the same element in an array. A phase difference or demodulated difference may involve taking the samples from 2 different sensor elements.

Many sensors have two outputs that can be differenced to correct for non-idealities and/or noise in the readout path. In some cases, those outputs can be two different states of one element, e.g., the reset and data states of an image pixel. In order to digitize the difference to remove some offset or error (e.g., the unknown offset of the source follower between the floating diffusion and the column line), various techniques of this disclosure can work out what the difference in the reset and data samples are by altering the voltages on one of the plates, e.g., the bottom plate of a capacitor, to cause the other plate, e.g., the top plate, to move thereby effectively tracking the voltage applied like a battery with the voltage that was sampled before conversion and eventually crossing the comparator whose output is used to work out where in the voltage movement the firing occurs as a digital value.

The voltage on the bottom plate of one capacitor can be ramped to perform a coarse or MSB first conversion, then a voltage representative of that conversion can be held. Next, a fine or LSB second conversion can be performed by adjusting the voltage on the bottom plate of the other capacitor until it crosses and the comparator fires again to derive a code containing the MSB conversion and LSB conversion that is the difference of the two samples.

It should be noted that in some cases the samples could be two outputs of one element, such as the 0-degree demodulated and the 180-degree demodulated output of a phase demodulated pixel. It should be noted that in some cases the samples could be two outputs of two elements, such as two pixels with different phase masks over them to help detect the focus of the imaging system. It should be appreciated the samples could come from a sensor that is not an imager. It should be noted that, in some configurations, it can be desirable to adjust the voltage using the bottom plate of the capacitor because the top plate can have a smaller parasitic and therefore there is less charge sharing that could introduce an error that can be difficult to correct.

Figure 3:
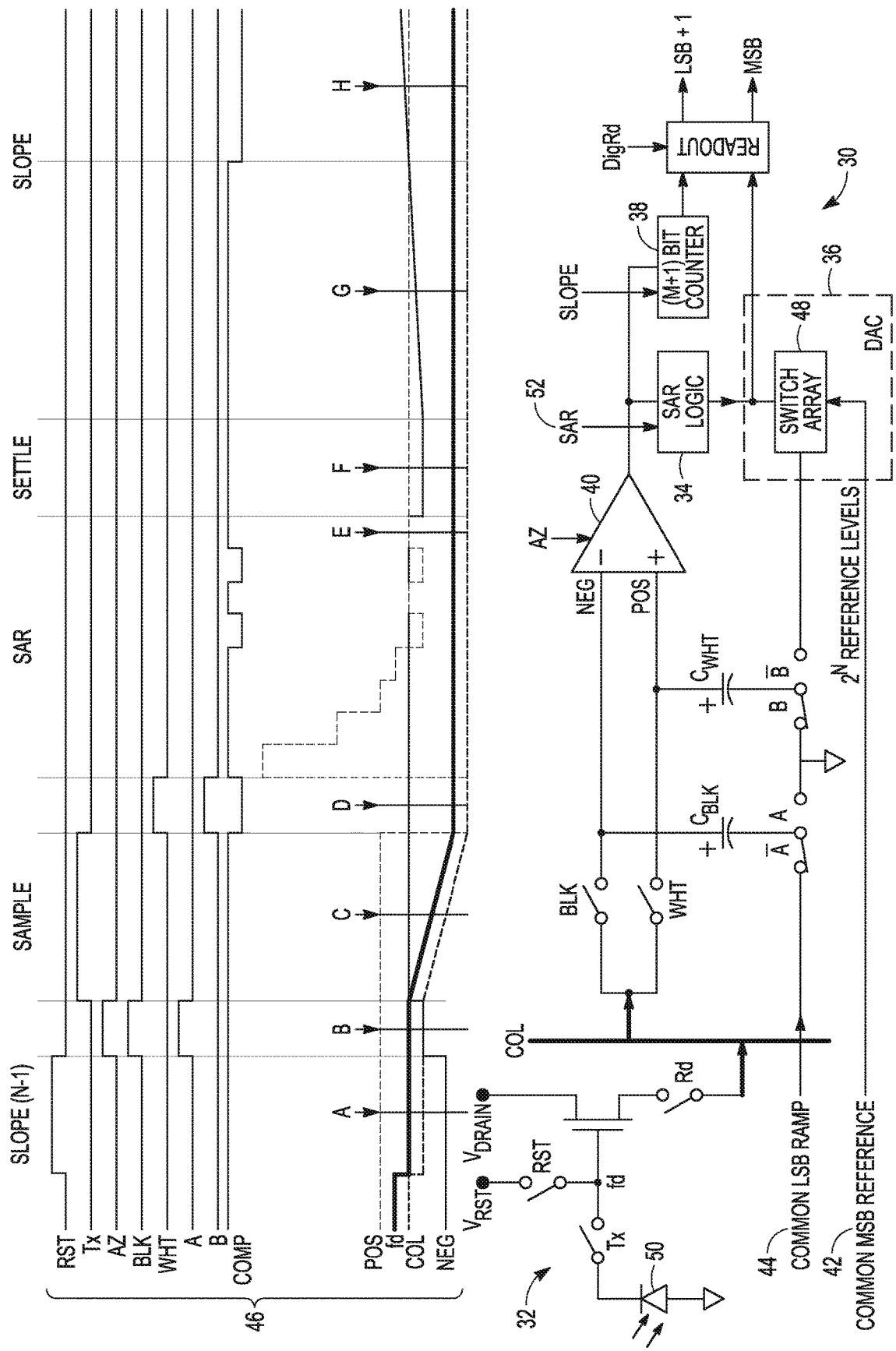
FIG. 3 depicts an example of a circuit diagram of a sub-ranging ADC circuit that can resolve the MSBs using a SAR ADC and the LSBs using a single-slope ADC and an associated timing diagram.

FIG. 3 depicts an example of a circuit diagram of a sub-ranging ADC circuit 30 that can resolve the MSBs using a SAR ADC and the LSBs using a single-slope ADC and an associated timing diagram. The ADC circuit 30 can be coupled to pixel cell 32 (or "pixel"), e.g., a four-transistor pixel cell, similar to the array described above in FIG. 1. The converter can also convert the difference between two readout values for examples to convert the difference between two phase detect pixels, or the difference between demodulated depth pixels. The converter can be applied to non-CIS applications were the difference between a signal value and a reference value is needed.

In FIG. 3, the sub-ranging ADC circuit 30 can include SAR ADC circuitry, including SAR logic circuit 34 and DAC circuit 36, and slope ADC circuitry, including counter circuit 38. The $V_{data}$ and $V_{rst}$ levels of the pixel can be sampled onto the top plates of separate sampling capacitors $C_{wht}$ and $C_{blk}$ of ADC 30 via switch Wht and switch Blk, respectively.

The ADC circuit 30 can further include a comparator 40 having an input to receive an auto-zero signal, an inverting input coupled to the top plate of sampling capacitor $C_{Blk}$, and a non-inverting input coupled to the top plate of sampling capacitor $C_{Wht}$.

The ADC circuit 30 can be coupled to a common MSB reference voltage line 42, e.g., shared between a number of parallel ADC circuits, and a common LSB ramp voltage line 44, e.g., shared between a number of parallel ADC circuits.

The timing diagram 46 depicts the relative timing of a reset (Rst) signal to operate the Rst switch of the pixel cell 32, a transmit (Tx) signal to operate the "Tx" switch of the pixel cell 32 (shown in FIG. 1 as "TG"), an auto-zero (AZ) signal applied to the comparator 40, a "Blk" signal to operate the "Blk" switch, a "Wht" signal to operate the "Wht" switch, an "A" signal to operate the "A"/"A_bar" switch coupled to the bottom plate of the sampling capacitor $C_{Blk}$, a "B" signal to operate the "B"/"B_bar" switch coupled to the bottom plate of the sampling capacitor $C_{Wht}$, and a comparator output signal "Comp".

As seen in FIG. 3, the "A" signal can couple the bottom plate of the sampling capacitor $C_{Blk}$ to ground and the "B" signal can couple the bottom plate of the sampling capacitor $C_{Wht}$ to ground. However, it should be noted that any reference can be used and it is not necessary to couple to ground. The "A_bar" signal can couple the bottom plate of the sampling capacitor $C_{Blk}$ to the common LSB ramp voltage line 44 and the "B_bar" signal can couple the bottom plate of the sampling capacitor $C_{Wht}$ to a switch array 48 of the DAC circuit 36, which can couple to the common MSB reference voltage line 42.

The timing diagram 46 further depicts example timing and relative voltages of the positive (pos) and negative (neg) nodes coupled to the inputs of the comparator 40, the column (col) voltage coupled to the output of the pixel cell 32, and the floating diffusion (fd) node voltage of the pixel cell 32. The various points in the timing diagram labeled (A)-(H) refer to associated switch configurations, for example, and are described in detail in FIGS. 3-9.

Figure 4:
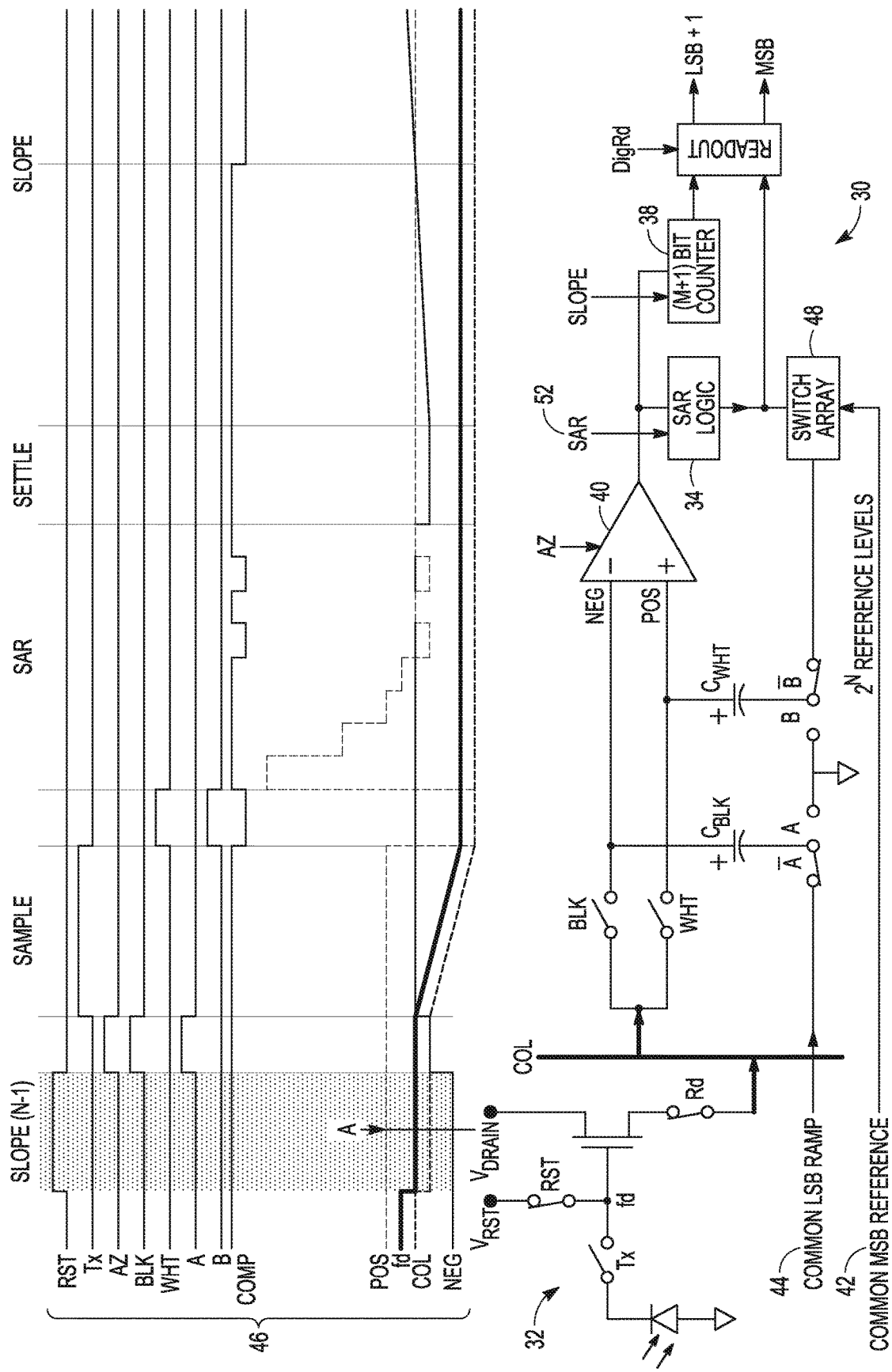
FIG. 4 depicts an example of a first phase of a circuit diagram of the sub-ranging ADC circuit 30 of FIG. 3 and an associated timing diagram.

FIG. 4 depicts an example of a first phase of a circuit diagram of the sub-ranging ADC circuit 30 of FIG. 3 and an associated timing diagram. The "A" phase is depicted in FIG. 4, and illustrates a portion of the reset phase. During the "A" phase, the Rst and Rd switches are closed, and both the floating diffusion node "fd" of the pixel cell 32 and the "col" line follow the voltage $V_{rst}$. The "B_bar" signal can couple the bottom plate of the sampling capacitor $C_{Wht}$ to the switch array 48 of the DAC circuit.

Figure 5:
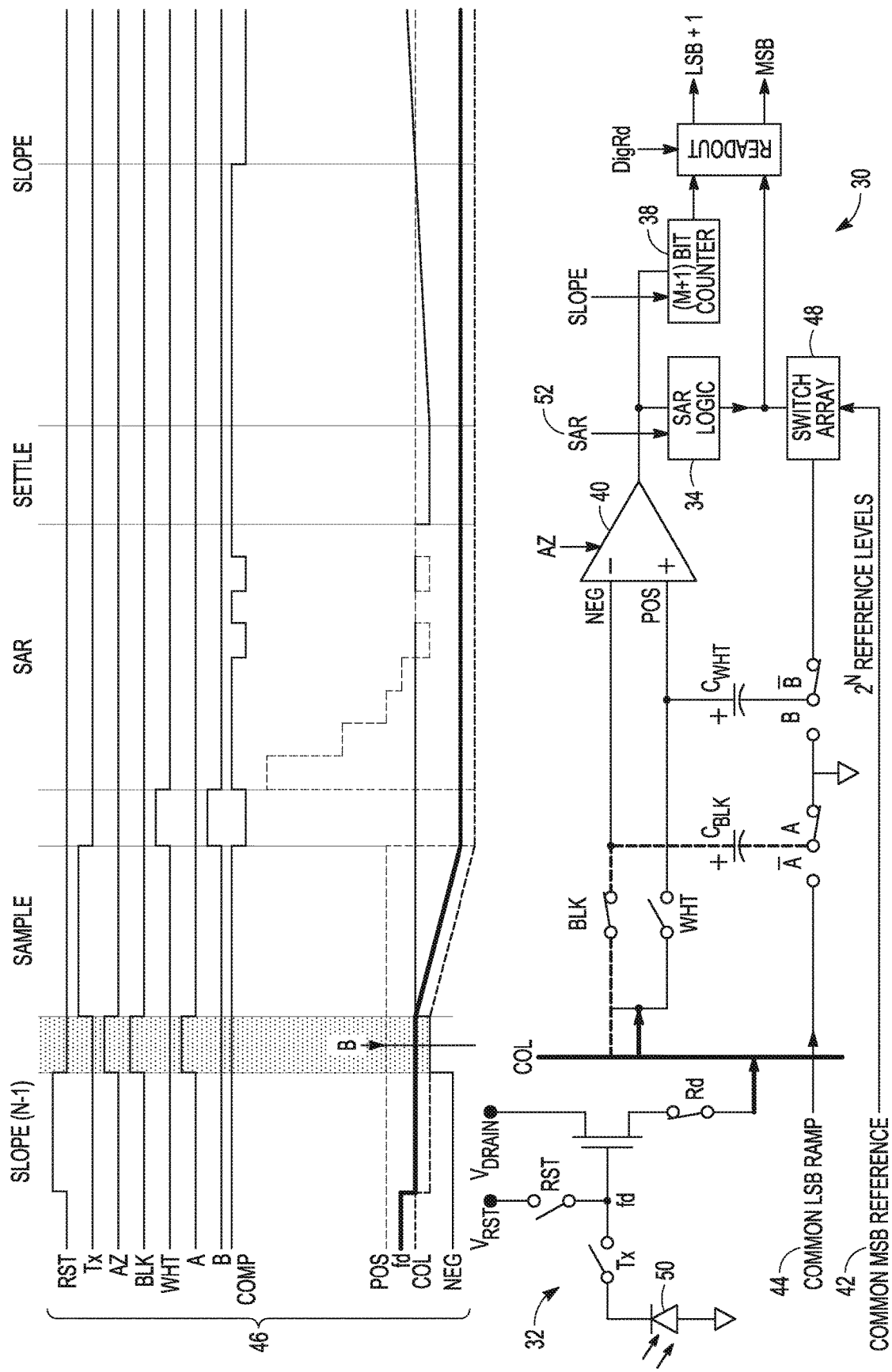
FIG. 5 depicts an example of a second phase of a circuit diagram of the sub-ranging ADC circuit 30 of FIG. 3 and an associated timing diagram.

FIG. 5 depicts an example of a second phase of a circuit diagram of the sub-ranging ADC circuit 30 of FIG. 3 and an associated timing diagram. The "B" phase is depicted in FIG. 5, and illustrates a portion of the reset phase. During the "B" phase, the Rd switch remains closed, the "Blk" signal closes the "Blk" switch, which shorts the node "neg" to "col", and the "A" signal couples the bottom plate of the sampling capacitor $C_{Blk}$ to ground. The bottom plate of the sampling capacitor $C_{Wht}$ can remain coupled to the switch array 48 of the DAC circuit. In this manner, charge on the pixel is transferred to the sampling capacitor $C_{Blk}$, which is charged to voltage $V_{rst}$. In addition, the comparator can be auto-zeroing.

Figure 6:
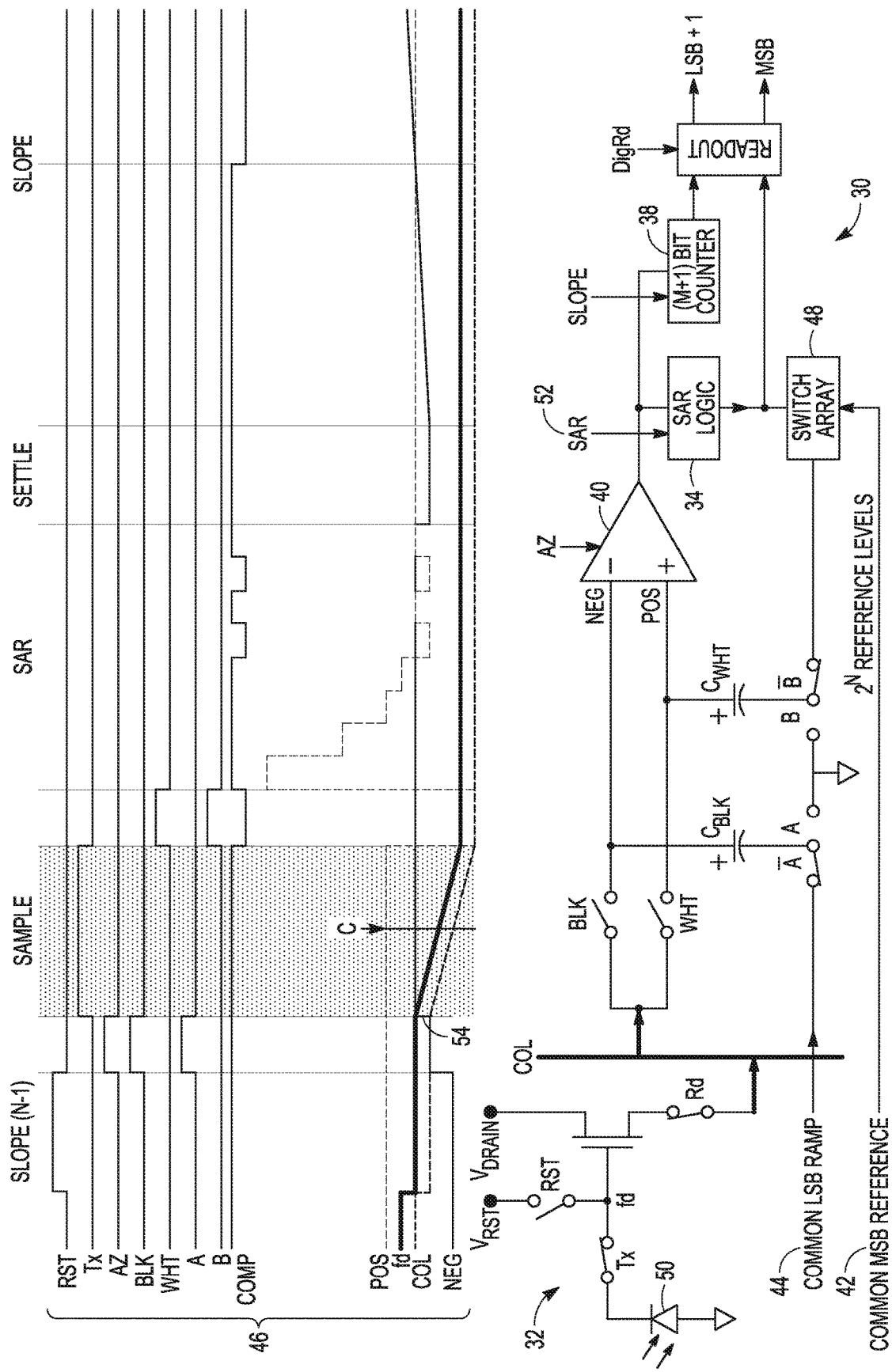
FIG. 6 depicts an example of a third phase of a circuit diagram of the sub-ranging ADC circuit 30 of FIG. 3 and an associated timing diagram.

FIG. 6 depicts an example of a third phase of a circuit diagram of the sub-ranging ADC circuit 30 of FIG. 3 and an associated timing diagram. The "C" phase is depicted in FIG. 6, and illustrates a portion of the sampling phase. During the "C" phase, the Rd switch remains closed, the "Blk" signal opens the "Blk" switch, and the "Tx" switch is closed, thereby connecting the photodiode 50 of the pixel cell 32 to the fd. The "col" follows this "fd" voltage through the source follower. The bottom plate of the sampling capacitor $C_{Wht}$ can remain coupled to the switch array 48 of the DAC circuit.

Previously, the reference level used to sample the capacitor $C_{Blk}$ was ground. Now, the "A_bar" signal can couple the bottom plate of the sampling capacitor $C_{Blk}$ to the common LSB ramp voltage, which can shift the bottom plate to provide an offset, e.g., a 0.5 MSB offset. The example 0.5 MSB offset is shown in the timing diagram at 54. While converting the MSBs with the SAR ADC portion of the ADC 30, the node "neg" can be artificially placed a 0.5 MSB higher so that the SAR ADC will finish 0.5 MSB higher than where it would have finished. Then, as described in more detail below, the 0.5 MSB offset can be removed such that when the slope ADC begins its cycles, it can start at ground and ramp up from below the position where the SAR ADC finished.

Figure 7:
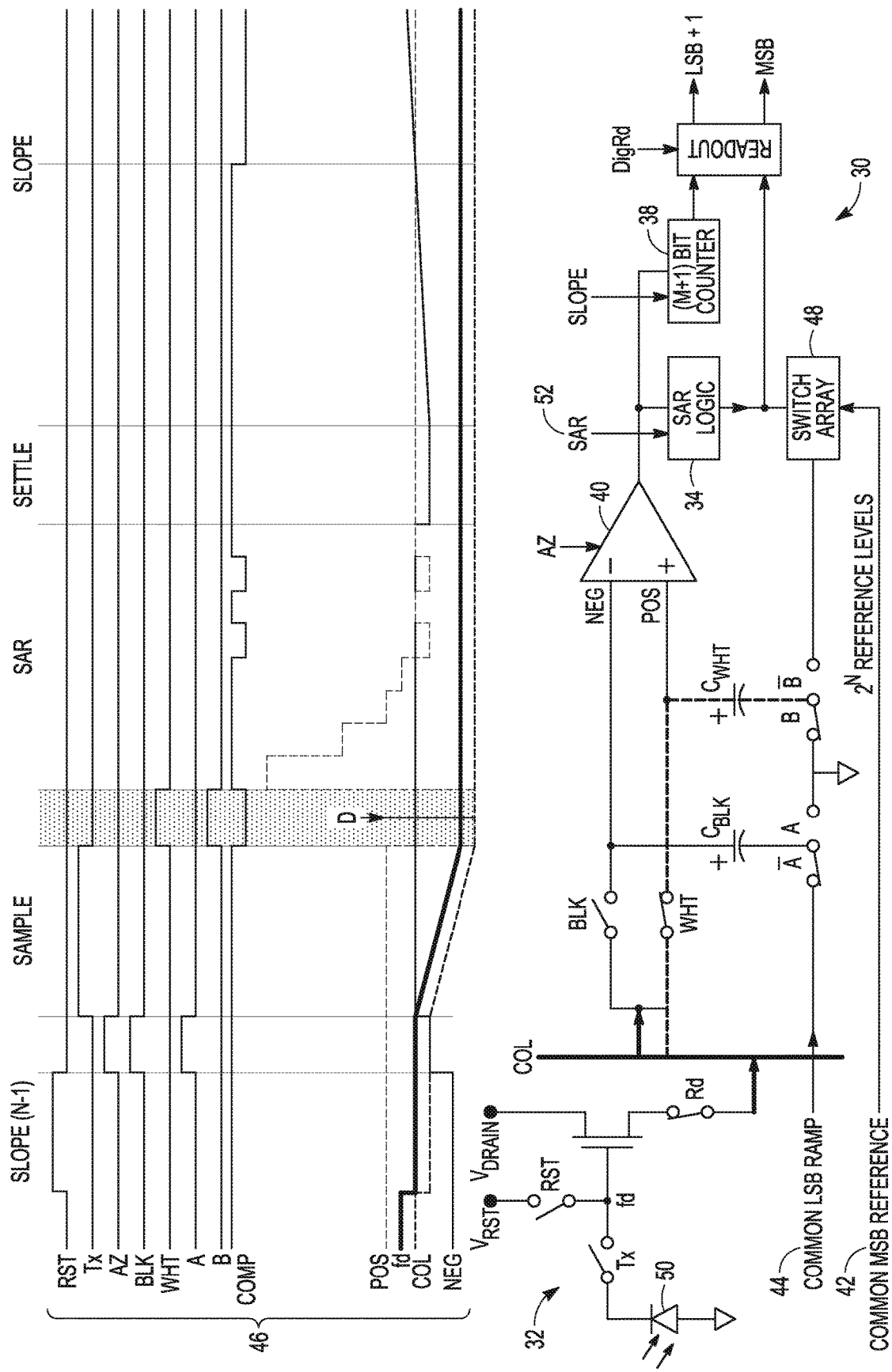
FIG. 7 depicts an example of a fourth phase of a circuit diagram of the sub-ranging ADC circuit 30 of FIG. 3 and an associated timing diagram.

FIG. 7 depicts an example of a fourth phase of a circuit diagram of the sub-ranging ADC circuit 30 of FIG. 3 and an associated timing diagram. The "D" phase is depicted in FIG. 7, and illustrates a portion of the sampling phase. During the "D" phase, the Rd switch remains closed, the "Blk" switch remains open, and the "Wht" signal closes the "Wht" switch, which shorts the node "pos" to "col". The "A_bar" signal couples the bottom plate of the sampling capacitor $C_{Blk}$ to the common LSB ramp voltage line. The "B" signal couples the bottom plate of the sampling capacitor $C_{Wht}$ to ground, which charges the sampling capacitor $C_{Wht}$ to $V_{data}$. The "D" phase represents the end of the sampling phase.

Figure 8:
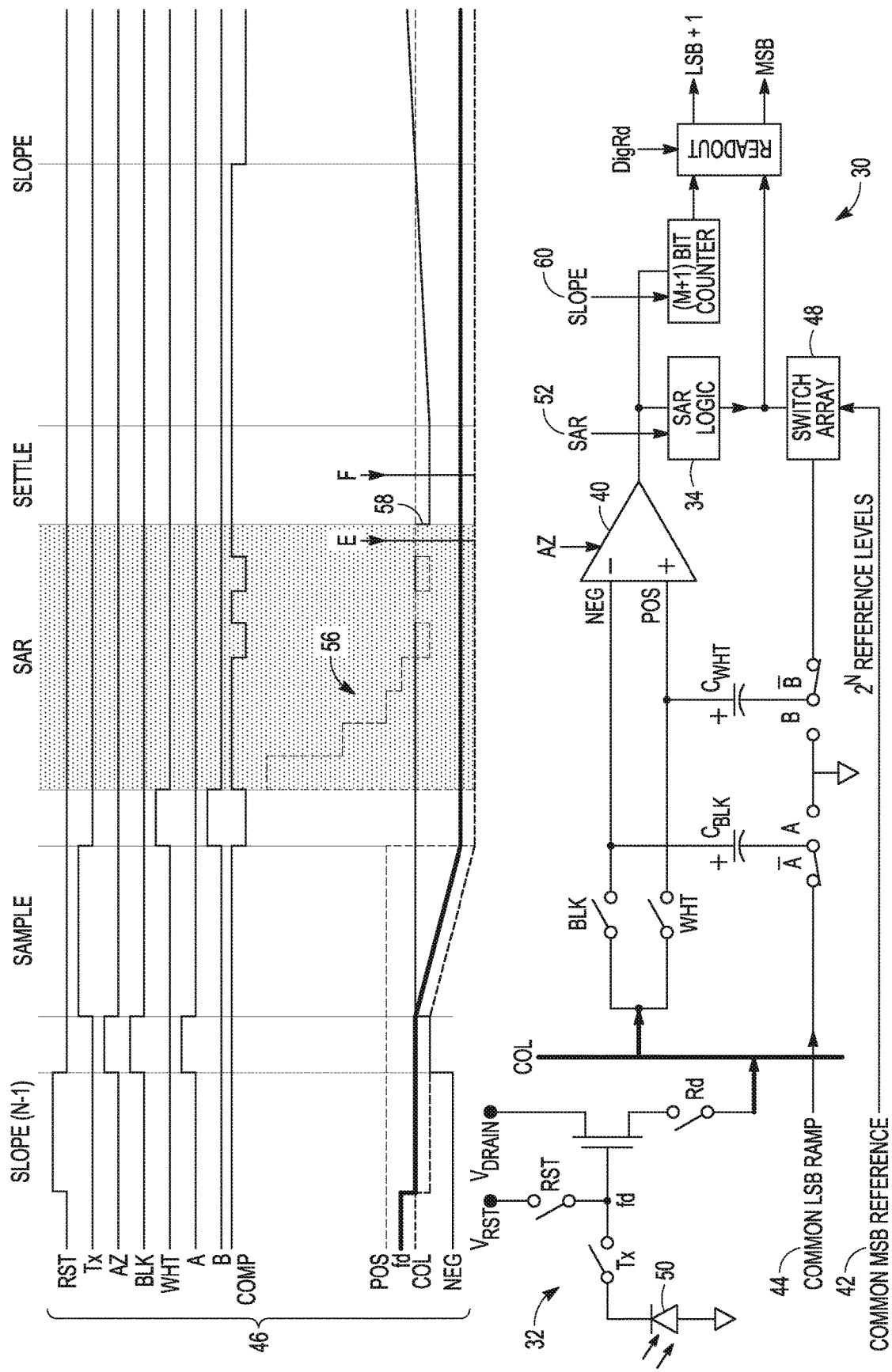
FIG. 8 depicts an example of fifth and sixth phases of a circuit diagram of the sub-ranging ADC circuit 30 of FIG. 3 and an associated timing diagram.

FIG. 8 depicts an example of fifth and sixth phases of a circuit diagram of the sub-ranging ADC circuit 30 of FIG. 3 and an associated timing diagram. The "E" and "F" phases are depicted in FIG. 8, and illustrate a portion of the SAR ADC stage. The SAR ADC stage is shown enabled via SAR signal 52.

During phase "E", the SAR operation stage, the "B_bar" signal can couple the bottom plate of the sampling capacitor $C_{Wht}$ to the switch array 48, and the SAR logic circuit 34 can couple the sampling capacitor $C_{Wht}$ to the reference voltages of the common MSB reference line via the switch array 48 of the DAC circuit. Here, the common MSB reference line can include $2^N$ reference voltage levels, which can be common to all the various ADC circuits that are converting in parallel. The SAR logic circuit 34 controls the switches of the switch array 48 to change the voltage on the bottom plate of the sampling capacitor $C_{Wht}$, which effectively changes the voltage on the top plate coupled to node "pos". The comparator circuit 40 compares the voltage on the node "pos" to the voltage on the node "neg". The result of this comparison determines the next reference level that will be chosen by the SAR logic at 52. The resulting sequence of reference levels chosen during this binary search are shown at 56 in the timing diagram 46. Other search methods are possible, and bit retrials can be performed during the search to reduce possible sources of error.

As mentioned previously, during the search, multiple different versions of the same references can be used. For example, there could be a 'dirty' reference used while the converter is searching the top few bits of the converter and a 'clean' version of the same reference used later in the search. This can help to minimize the impact of charging any parasitic capacitance of the caps or comparator during the search phase, and to minimize sources of crosstalk between multiple converters on multiple columns that share the same references. Due to the 0.5 MSB offset previously applied to the sampling capacitor $C_{Blk}$, the SAR operation has finished "high". The conversion result determined by the SAR operation represents the MSBs.

During phase "F", the SAR result stage, the previously applied 0.5 MSB offset can be removed, as shown in the timing diagram at 58. When the slope ADC begins its cycles, it can start at ground and ramp up from below the position where the SAR ADC finished its operation, without having to create a negative voltage. The use of the offset can reduce the precision needed for the comparator circuit 40, which can reduce power consumption. The conversion result determined by the slope operation represents the LSBs.

The SAR/single-slope ADC approach described above makes use of analog correlated double sampling (CDS) techniques. The SAR/single-slope ADC approach described above utilizes the sampling capacitors $C_{Wht}$ and $C_{Blk}$ that are storing the $V_{data}$ and $V_{rst}$ levels, respectively, to perform the CDS.

In addition, the approach can utilize a bottom plate driving scheme, as described above. That is, when the voltage changes on the bottom plates of the sampling capacitors $C_{Wht}$ and $C_{Blk}$, the voltage on nodes "pos" and "neg", respectively, move in response. This is in contrast to other SAR techniques, such as charge sharing.

Bottom plate driving can reduce the need for sampling capacitors $C_{Wht}$ and $C_{Blk}$ to be high accuracy because charge accuracy is not needed for these sampling capacitors. Rather, the sampling capacitors $C_{Wht}$ and $C_{Blk}$ can be considered as voltage translation devices. It is not significant if the sampling capacitors $C_{Wht}$ and $C_{Blk}$ change capacitance and become nonlinear as long as the parasitic capacitance sharing of nodes "neg" and "pos" is small.

Further, the SAR/single-slope ADC approach described above allows essentially a digital encoded hold. That is, after driving the bottom plate of the sampling capacitor $C_{Wht}$ to various voltage levels via the common MSB reference line 42 and the switch array 48 and performing the SAR operation, the voltage on sampling capacitor $C_{Wht}$ can be held, as long as the reference voltage levels are stable. Unlike a small capacitor of a typical SAR CDAC array that can leak or change, the larger sampling capacitor $C_{Wht}$ in this approach can have a real-time low bandwidth that has a level set by the common MSB reference voltages.

Further still, unlike other SAR approaches that utilize a DAC including an array of capacitors that each can be coupled to one positive reference voltage and one ground to generate the DAC level locally, the SAR/single-slope ADC approach described above utilizes a DAC that can couple a single capacitor to one of multiple incoming reference levels ($2^N$ reference levels) where the particular reference levels are determined locally by the SAR logic circuit 34 and connected via the switch array 48. This technique allows for the multiple reference levels to be shared between multiple ADCs and allows separate operations to be performed on the sampling capacitors $C_{Wht}$ and $C_{Blk}$. That is, a SAR stage operation can be performed on the sampling capacitor $C_{Wht}$, a slope stage operation can be performed on the sampling capacitor $C_{Blk}$, and a difference can be taken between the two sampling capacitors $C_{Wht}$ and $C_{Blk}$. In addition, the size of the ADC circuit implemented using the techniques of this disclosure can be reduced by eliminating the array of capacitors in the DAC. A smaller ADC circuit allows an increased channel count, which can result in an increase in throughput and, therefore, an increase in image capture frame rate. These shared references may be generated by strings of resistors, with or without buffer amplifiers and decoupling, and as they are shared any trimming or optimization of these references for desired transfer function of the system is common to all converters attached to them. This can lead to economies in test and calibration.

Figure 9:
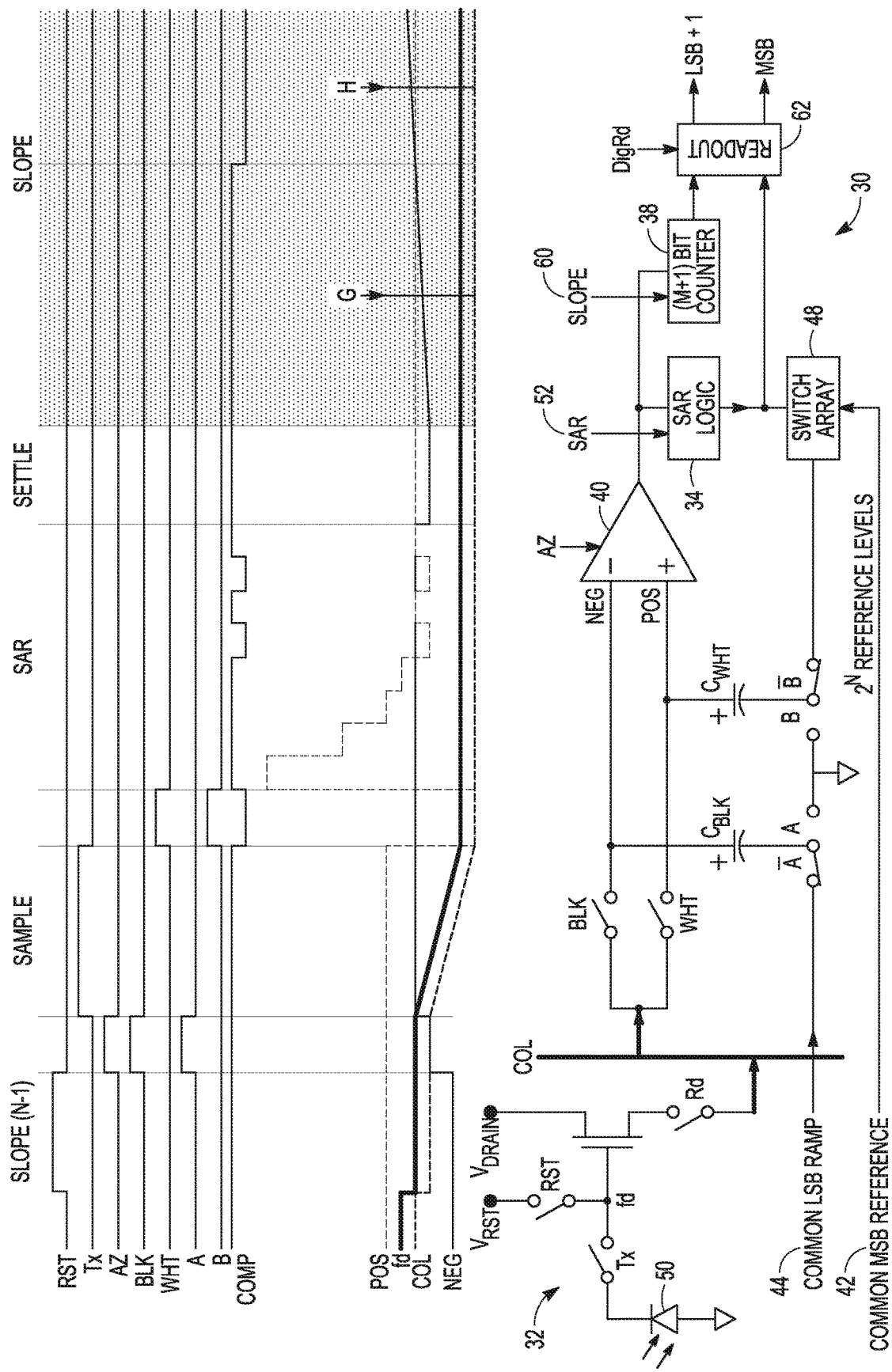
FIG. 9 depicts an example of seventh and eighth phases of a circuit diagram of the sub-ranging ADC circuit 30 of FIG. 3 and an associated timing diagram.

FIG. 9 depicts an example of seventh and eighth phases of a circuit diagram of the sub-ranging ADC circuit 30 of FIG. 3 and an associated timing diagram. The "G" and "H" phases are depicted in FIG. 9, and illustrate a portion of the slope ADC stage. The slope ADC stage is shown enabled via slope signal 60.

During phase "G", the slope operation stage, the bottom plate of the sampling capacitor $C_{Wht}$ remains coupled to the switch array 48, and the bottom plate of the sampling capacitor $C_{Blk}$ remains coupled to the common LSB ramp line 44. During phase "G", the SAR DAC retains its value determined during the SAR stage, and the bottom plate of the sampling capacitor $C_{Blk}$ ramps up in response to the voltage applied via common LSB ramp line 44 and the (M+1) counter circuit 38 begins counting. The voltage ramping increases the voltage on the node "neg" with respect to the voltage on the node "pos". As the ramping continues, the counter continues to increment.

During phase "H", the slope result stage, the counter 38 stops when the output of the comparator circuit 40 indicates, e.g., the output goes low, that the voltage on the node "neg" is greater than the voltage on the node "pos".

The counter 38 can be implemented locally to each ADC. A clock signal can be applied and the moment that the comparator circuit 40 fires, the counter stops.

In another implementation, the counter circuit 38 can be a shared counter. For example, M+1 bits of digital data can be transmitted across a bus that is shared between the ADCs, and each ADC can have a local memory device, e.g., three transistor DRAM cell, to store the data that was on the bus at the moment the comparator circuit 40 fires.

A readout circuit 62 reads the stored results of the SAR stage (MSBs) and the stored results of the slope stage (LSBs) and combines the results. It should be noted that the combination can involve some error correction to account for, among other things, the over-and-under ranging slope stage that resulted from the 0.5 MSB offset that was initially applied.

In some configurations, parasitic capacitances can be introduced at the input of the comparator circuit, which can result in gain errors in the ADC. The gain error can occur when the parasitic input capacitances are non-linear, which can be the case for the input transistors in the comparator circuit. To reduce charge error at the input of the comparator circuit, various switching techniques can be implemented, as shown in FIG. 10.

Figure 10:
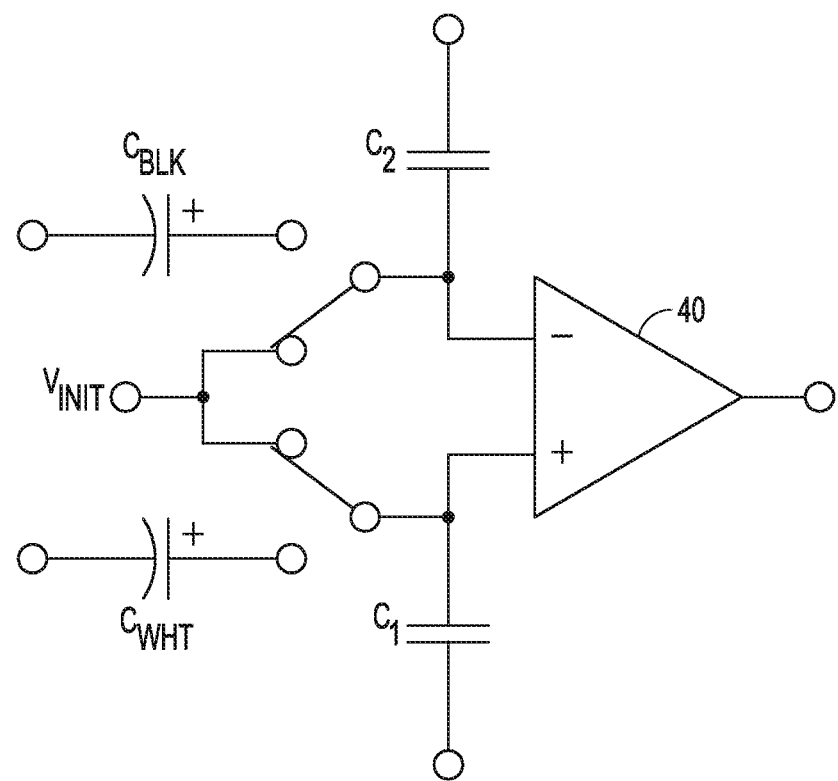
FIG. 10 depicts an example of a comparator switch arrangement that can overcome the non-linearity in the parasitic capacitors at the input of the comparator circuit.

FIG. 10 depicts an example of a comparator switch arrangement that can overcome the non-linearity in the parasitic capacitors at the input of the comparator circuit. To reduce the charge error to zero, the charge stored in both parasitic input capacitances must be equal at sampling. To meet the condition $V_{C1}(0)=V_{C2}(0)$, both inputs of the comparator circuit 40 can be shorted to $V_{init}$ during sampling. Shorting the inputs of the comparator circuit 40 to $V_{init}$ can cause an equal charge to be stored at $C_1$ and $C_2$ during sampling.

To reduce the charge error to near zero, each parasitic input capacitance during sampling should have the same 'state' as at the end-of-conversion (EOC). The EOC can effectively be considered the desired trip point of the comparator. That is, the charges stored in each parasitic input capacitance after sampling should be equal to their EOC. During the conversion, the negative terminal will always be within 0.5 MSB of the $V_{rst}$ level. Therefore, to approximate the condition $V_{C1}(0)=V_{C1}(EOC)$ for the negative terminal, $V_{init}$ should be set equal to $V_{rst}$.

In FIG. 10, both switches are coupled to $V_{init}$ during sampling. Then, when using the SAR ADC or when ramping using the slope ADC, the switches are coupled to the sampling capacitors $C_{Blk}$ and $C_{Wht}$. The charge on capacitor C2, which has a voltage dependence, is shared with sampling capacitor $C_{Blk}$ (which is being ramped) thereby canceling the error contribution from capacitor C2.

An advantage of various techniques of this disclosure is that it allows analog CDS (e.g., storing the reset value of the pixel, then the exposed value of the pixel) in the analog domain into capacitors that do not have to be very linear. This is because charge summing is not performed at the input of the comparator circuit of the ADC. Rather, voltage differencing is performed, whereby a bottom plate of one capacitor is driven by the SAR ADC to different voltage levels using a common MSB voltage reference line to perform the SAR operation. Then, the capacitor is held at the common voltage reference, and then the slope ADC applies a ramping voltage to the other capacitor to do the slope function. The capacitors do not need to be linear and, as such, they can be metal oxide semiconductor (MOS) capacitors, for example, if adequately biased. The transfer function of the ADC can be improved by using one or more of the following: relatively large sampling capacitors, a small comparator input capacitor, and by pre-charging the comparator input to the trigger point voltage $V_{rst}$ before connecting the comparator circuit (this phase can be used to auto-zero the comparator). These techniques not only help reduce the size of the ADC, but also reduce the noise floor.

Another benefit of using analog CDS within the ADC is that a single conversion is needed, which can save time and power and reduce noise.

Figure 11:
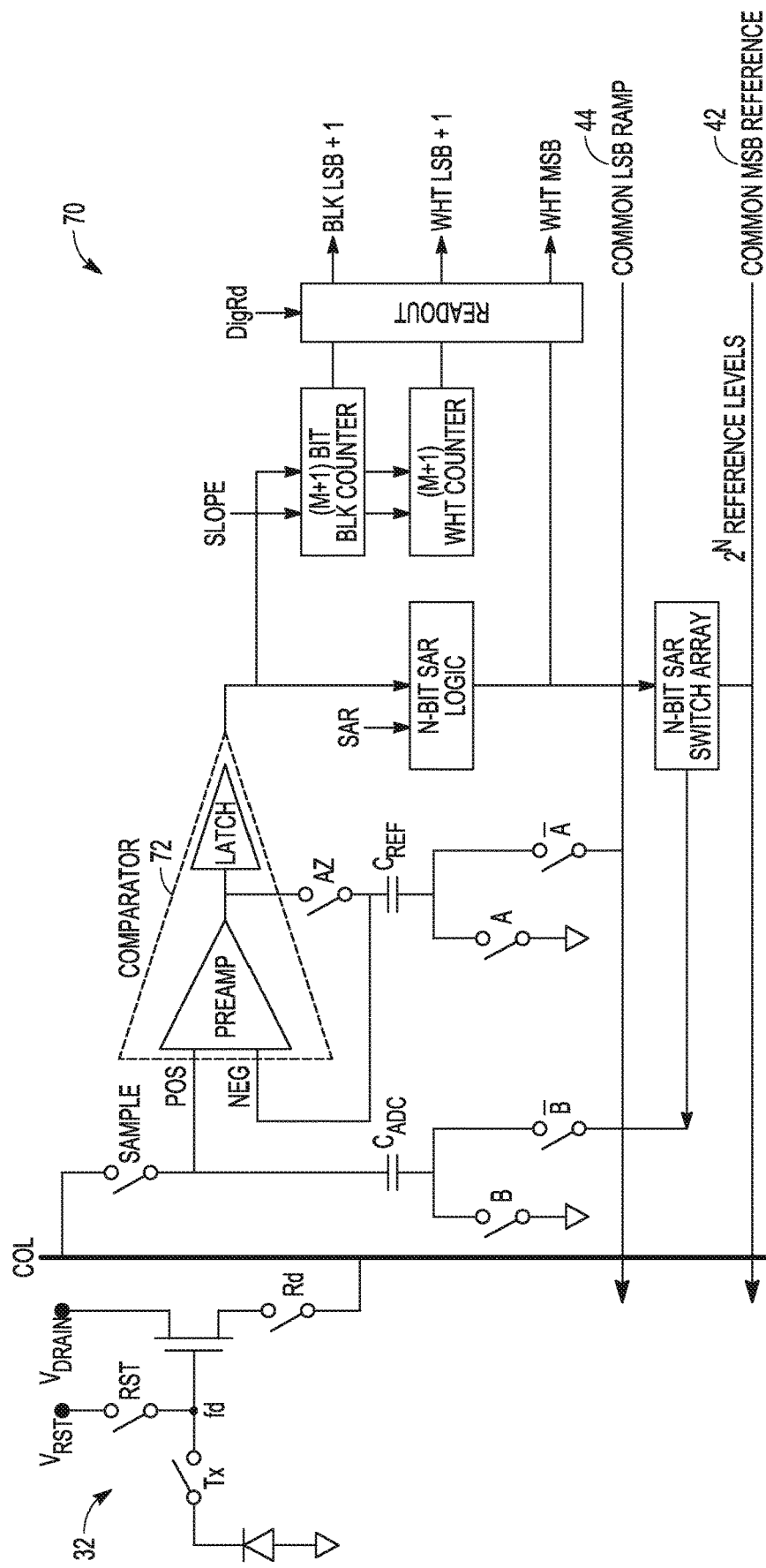
FIG. 11 depicts an example of a circuit for sub-ranging with first step SAR/single-slope CDS bottom plate N+M bit ADC using digital CDS.

FIG. 11 depicts an example of a circuit for subranging with first step SAR/single-slope CDS bottom plate N+M bit ADC using digital CDS. Here, the circuit 70 performs a conversion for the data level first and performs a conversion for the reset level. Unlike the other scheme described above, there are not two capacitors Blk and Wht that store the reset and data levels. Rather, the circuit 70 has one capacitor $C_{adc}$ that stores a value to be converted by the ADC and one capacitor $C_{ref}$ that stores the reference voltage to be used for the conversion, e.g., including an offset of the comparator circuit.

The operation of the circuit 70 will now be described generally. First, the pixel cell 32 is reset. While the pixel cell 32 is being reset, the capacitor $C_{ref}$ can be auto-zeroed. The auto-zero operation stores the offset of the comparator circuit 72 on the capacitor $C_{ref}$. The reset of the pixel cell can be released and then $V_{rst}$, which can include the noise present, can be stored on the capacitor $C_{adc}$. Then, the "A_bar" switch closes, coupling the bottom plate of the capacitor $C_{ref}$ to the common LSB ramp line 44, and a ramp voltage is applied until the comparator circuit 72 fires. In this scheme, it is possible to design it such that no SAR stage is required for converting $V_{rst}$ since this level should be known to within one MSB. Therefore the ramp start and end voltage can be chosen to span the expected $V_{rst}$ level.

Next, the $V_{data}$ level of the pixel is transferred to the capacitor $C_{adc}$. A SAR operation stage can be performed for the N MSB bits by driving the bottom place of $C_{adc}$ and then a slope stage can be performed for the M LSB bits by driving the bottom plate of $C_{ref}$ as described above. As described previously the conversion associated with $V_{rst}$ and $V_{data}$ respectfully can be subtracted to perform digital CDS.

In addition to the SAR-Slope techniques described above, alternative techniques such as Slope-Slope, SAR-SAR, SAR-SAR-SLOPE, and Slope-Slope with analog storage can be used. Each is described in turn below.

In a SAR-Slope technique, if the first stage is a binary SAR search, then the comparator is required to have low hysteresis. In a Slope-Slope technique, such as described below with respect to FIG. 12, replacing the first stage with a digital slope as well relaxes this requirement for the comparator. This option is slower ($2^N + 2^{(M+1)}$ steps), but allows the comparator to have the lowest power of all variants, and relaxes the settling requirements on the references.

In a SAR-SAR technique, the second stage can also be a SAR stage instead of a slope. This option would have the highest conversion speed (N+M+1 steps), but also causes the comparator to have the highest power of all variants since the final stage requires low hysteresis. It also requires an additional $2^{(M+1)}$ reference levels to be generated and distributed around the array, as instead of 1 wire being needed to distribute a signal for a slope conversion, to perform a SAR algorithm for the second stage of conversion $2^{\wedge}(M+1)$ wires are needed.

A SAR-SAR-SLOPE technique is an extension of the SAR-SAR configuration, with a third conversion added. The second stage conversion can be made to be M levels, and an extra conversion stage is added were each of the 2(M levels used in the second stage are all ramped over L+1 levels in a slope manner. The range of their slope is chosen to overlap the nominal levels of the second stage, in a similar manner to the slope conversion in the SAR-SLOPE variant. In this way a conversion of $2^{\wedge}(L+M+N)$ precision can be achieved in $2^{\wedge}(L+1)+M+N$ cycles. The advantage of this is that the number of levels needed to be routed around is greatly reduced, as its possible to make $2^{\wedge}M+2^{\wedge}N$ is less than $2^{\wedge}(M+N)$. For example to achieve a 14bit conversion, one could make it from L=5, M=5, N=4, which compared to the example of the SAR-SLOPE converter with M=6 and N=8 has 48 reference levels rather than 256.

A Slope-Slope with analog storage technique can also be utilized, as described below in detail with respect to FIGS. 12 and 13. Using a single reference ramp, the bottom plate of $C_{blk}$ is held constant while the bottom plate of $C_{wht}$ is ramped. This voltage is also connected to $C_{wht}$. When the comparator decision changes, the current value of the ramp is held on $C_{wht}$ by opening the switch $\overline{B}$. A smaller ramp is then applied to $C_{blk}$ as in the previous description. This could be extended with more capacitors and switches to make an arbitrary number of single slope stages at the cost of area and complexity.

Figure 12:
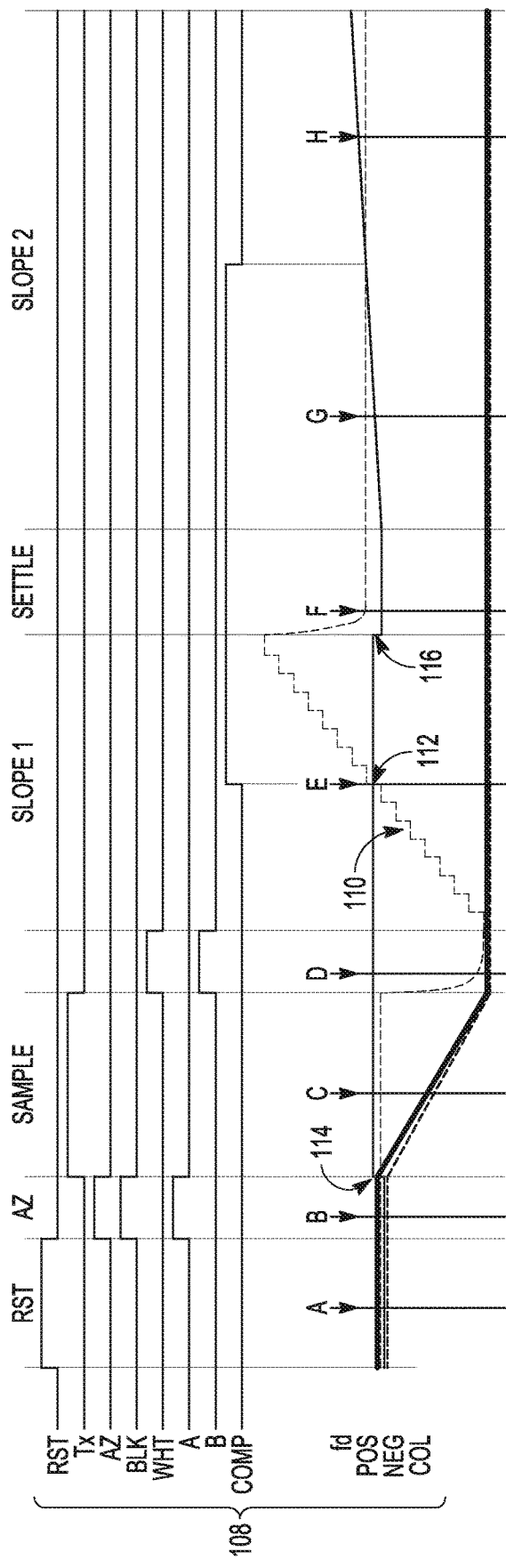
FIG. 12 depicts another example of a circuit diagram of a sub-ranging ADC circuit that can resolve the MSBs using a first single-slope ADC and the LSBs using a second single-slope ADC and an associated timing diagram.
Figure 12:
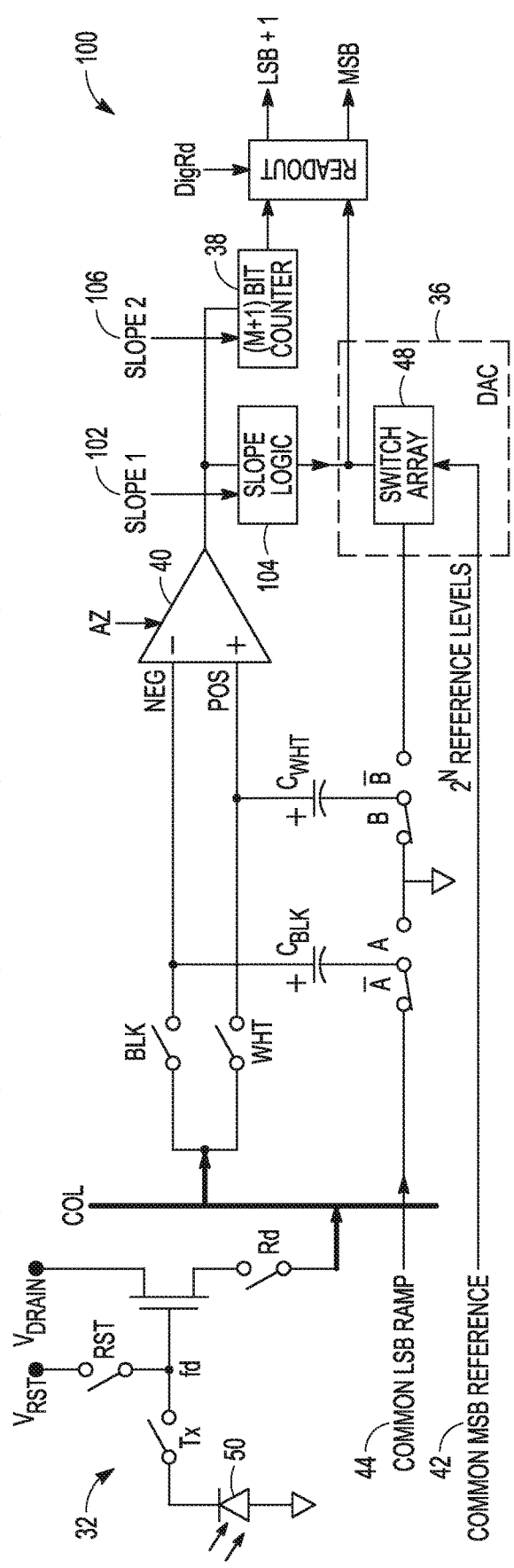

FIG. 12 depicts another example of a circuit diagram of a sub-ranging ADC circuit 100 that can resolve the MSBs using a first single-slope ADC and the LSBs using a second single-slope ADC and an associated timing diagram. The ADC circuit 100 can be coupled to pixel cell 32 (or "pixel"), e.g., a four-transistor pixel cell, similar to the array described above in FIG. 1. The converter can also convert the difference between two readout values for example to convert the difference between two phase detect pixels, or the difference between demodulated depth pixels. The converter can be applied to non-CIS applications where the difference between a signal value and a reference value is needed.

In FIG. 12, the sub-ranging ADC circuit 100 can include first slope ADC circuitry, including slope logic circuit 104 and DAC circuit 36, and second slope ADC circuitry, including counter circuit 38. The $V_{rst}$ and $V_{data}$ levels of the pixel can be sampled onto the top plates of separate sampling capacitors $C_{wht}$ and $C_{blk}$ of ADC 100 via switch Wht and switch Blk, respectively.

The ADC circuit 100 can further include a comparator 40 having an input to receive an auto-zero signal (AZ), an inverting input coupled to the top plate of sampling capacitor $C_{Blk}$, and a non-inverting input coupled to the top pate of sampling capacitor $C_{Wht}$.

The ADC circuit 100 can be coupled to a common MSB reference voltage line 42, e.g., shared between a number of parallel ADC circuits, and a common LSB ramp voltage line 44, e.g., shared between a number of parallel ADC circuits.

The timing diagram 108 depicts the relative timing of a reset (Rst) signal to operate the Rst switch of the pixel cell 32, a transmit (Tx) signal to operate the "Tx" switch of the pixel cell 32, an auto-zero (AZ) signal applied to the comparator 40, a "Blk" signal to operate the "Blk" switch, a "Wht" signal to operate the "Wht" switch, an "A" signal to operate the "A"/"A_bar" switch coupled to the bottom plate of the sampling capacitor $C_{Blk}$, a "B" signal to operate the "B"/"B_bar" switch coupled to the bottom plate of the sampling capacitor $C_{Wht}$, and a comparator output signal "Comp".

As seen in FIG. 12, the "A" signal can couple the bottom plate of the sampling capacitor $C_{Blk}$ to ground and the "B" signal can couple the bottom plate of the sampling capacitor $C_{Wht}$ to ground. However, it should be noted that any reference voltage can be used and it is not necessary to couple to ground. The "A_bar" signal can couple the bottom plate of the sampling capacitor $C_{Blk}$ to the common LSB ramp voltage line 44 and the "B_bar" signal can couple the bottom plate of the sampling capacitor $C_{Wht}$ to a switch array 48 of the DAC circuit 36, which can couple to the common MSB reference voltage line 42.

The timing diagram 106 further depicts example timing and relative voltages of the positive (pos) and negative (neg)

nodes coupled to the inputs of the comparator 40, the column (col) voltage coupled to the output of the pixel cell 32, and the floating diffusion (fd) node voltage of the pixel cell 32. The various points in the timing diagram labeled (A)-(H) refer to associated switch configurations, for example.

Figure 13:
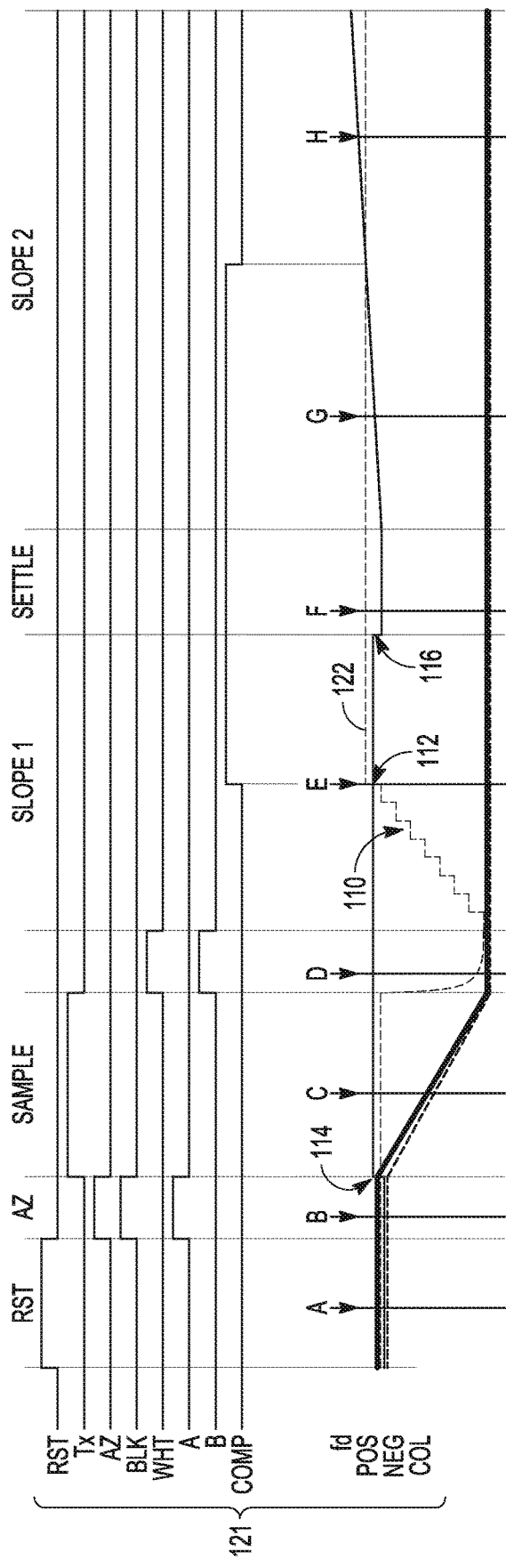
FIG. 13 depicts another example of a circuit diagram of a sub-ranging ADC circuit that can resolve the MSBs using a first single-slope ADC and the LSBs using a second single-slope ADC and an associated timing diagram.
Figure 13:
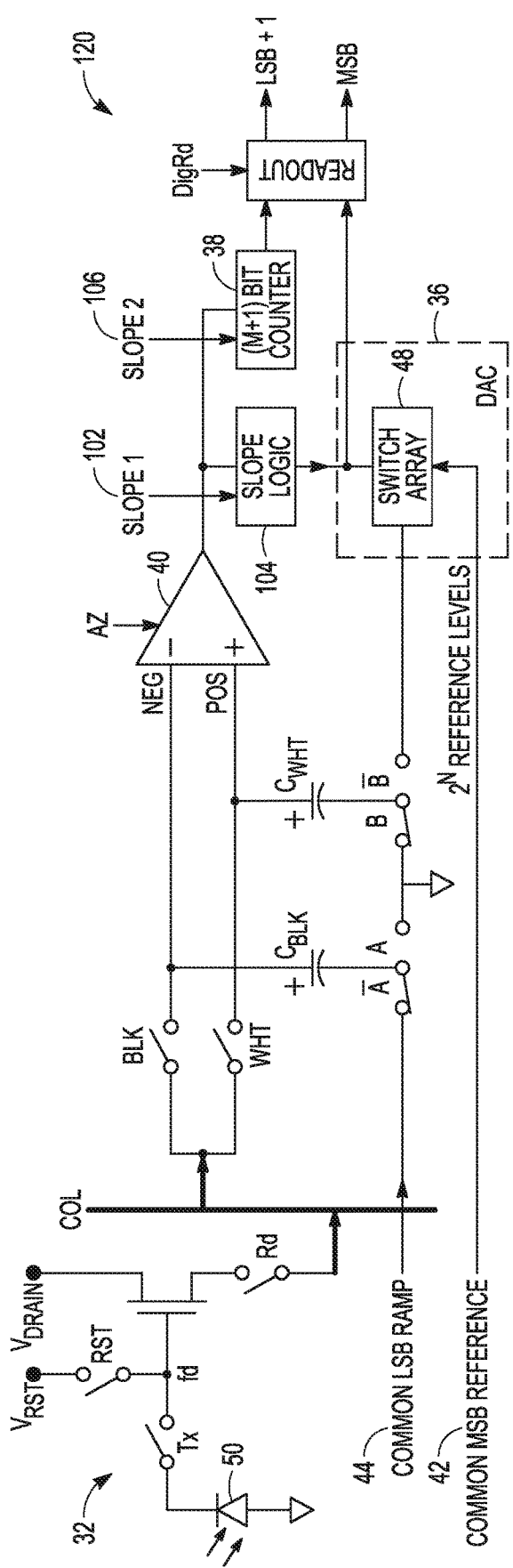

Many of the phases (A)-(H) in the Slope-Slope configuration of FIGS. 12 and 13 are similar to those described above with respect to the SAR-Slope configuration of FIGS. 4-9. For purposes of conciseness, only the differences between the operation of the Slope-Slope configuration and the SAR-Slope configuration will be described, specifically with respect to phases (E) and (F).

The "E" and "F" phases illustrate a portion of the first slope ADC stage. The first slope ADC stage is shown enabled via Slope 1 signal 102.

During phase "E", the first slope ADC operation stage, the "B_bar" signal can couple the bottom plate of the sampling capacitor $C_{Wht}$ to the switch array 48, and the slope logic circuit 104 can couple the sampling capacitor $C_{Wht}$ to the reference voltages of the common MSB reference line via the switch array 48 of the DAC circuit 36. Here, the common MSB reference line can include $2^N$ reference voltage levels, which can be common to all the various ADC circuits that are converting in parallel.

The slope logic circuit 104 controls the switches of the switch array 48 to change the voltage on the bottom plate of the sampling capacitor $C_{Wht}$, which effectively changes the voltage on the top plate coupled to node "pos". The comparator circuit 40 compares the voltage on the node "pos" to the voltage on the node "neg". The result of this comparison determines the next reference level that will be chosen by the slope logic at 102. The resulting sequence of reference levels chosen during this linear ramp are shown at 110 in the timing diagram 106. The linear ramp of the first slope ADC is in contrast to the decision-based higher or lower searching performed by the SAR logic described above with respect to FIGS. 3-9.

As mentioned previously, during the search, multiple different versions of the same references can be used. For example, there can be a 'dirty' reference used while the converter is searching the top few bits of the converter and a 'clean' version of the same reference used later in the search. This can help to minimize the impact of charging any parasitic capacitance of the caps or comparator during the search phase, and to minimize sources of crosstalk between multiple converters on multiple columns that share the same references.

It should be note that although the SAR ADC circuit of FIGS. 3-9 can be faster than a slope ADC circuit (N cycles vs. $2^N$ cycles for a conversion), a comparator in a slope ADC circuit need not fire as quickly as a comparator in a SAR ADC circuit and, as such, can be a lower power, slower comparator.

The first slope ADC circuit proceeds until the comparator 40 determines that the value of the linear ramp of the first slope ADC circuit crosses the "neg" value, which is shown at 112 in FIG. 12. In some example configurations, such as shown in FIG. 12, the comparator can latch the value at which the ramp crossed the "neg" value and the ramp can continue, e.g., until it reaches full scale. In some configurations, it can be desirable to continue ramping, as in FIG. 12, due to loading considerations. Alternatively, as shown in FIG. 13, the ramp can stop at the crossing value. As described above with respect to the SAR-Slope ADC configuration, due to the 0.5 MSB offset previously applied to the sampling capacitor $C_{Blk}$, the first slope operation has finished "high". The use of the offset can reduce the precision needed for the comparator circuit 40, which can reduce power consumption.

Prior to or during phase "F", the second slope ADC stage, the previously applied offset (shown at 114), e.g., 0.5 MSB, can be removed, as shown in the timing diagram at 114. When the second slope ADC begins its cycles, it can start at ground and ramp up from below the position where the first slope ADC finished its operation, e.g., the value at which the comparator latched when the ramp crossed the "neg" value, without having to create a negative voltage.

During the second slope ADC operation stage, the bottom plate of the sampling capacitor $C_{Wht}$ remains coupled to the switch array 48, and the bottom plate of the sampling capacitor $C_{Blk}$ remains coupled to the common LSB ramp line 44. The first slope ADC retains its value determined during the first slope ADC stage, and the bottom plate of the sampling capacitor $C_{Blk}$ ramps up in response to the voltage applied via common LSB ramp line 44 and the (M+1) counter circuit 38 begins counting. The voltage ramping increases the voltage on the node "neg" with respect to the voltage on the node "pos". As the ramping continues, the counter continues to increment. The counter 38 stops when the output of the comparator circuit 40 indicates, e.g., the output goes low, that the voltage on the node "neg" is greater than the voltage on the node "pos".

The offset applied prior to the first conversion operation, e.g., 0.5 MSB, allows the second conversion operation to cover more then two times the offset of range. For example, an offset of 0.5 MSB allows the second conversion to cover more than 1 MSB of range. A smaller or larger offset can be provided to cover a smaller or larger MSB range, as desired.

The Slope-Slope ADC approach described above makes use of analog correlated double sampling (CDS) techniques. The Slope-Slope ADC approach described above utilizes the sampling capacitors $C_{Wht}$ and $C_{Blk}$ that are storing the $V_{data}$ and $V_{rst}$ levels, respectively, to perform the CDS.

In addition, the approach can utilize a bottom plate driving scheme, as described above. That is, when the voltage changes on the bottom plates of the sampling capacitors $C_{Wht}$ and $C_{Blk}$, the voltage on nodes "pos" and "neg", respectively, move in response. This is in contrast to other techniques, such as charge sharing.

Bottom plate driving can reduce the need for sampling capacitors $C_{Wht}$ and $C_{Blk}$ to be high accuracy because charge accuracy is not needed for these sampling capacitors. Rather, the sampling capacitors $C_{Wht}$ and $C_{Blk}$ can be considered as voltage translation devices. It is not significant if the sampling capacitors $C_{Wht}$ and $C_{Blk}$ change capacitance and become nonlinear as long as the parasitic capacitance sharing of nodes "neg" and "pos" is small.

Further, the Slope-Slope ADC approach described above allows essentially a digital encoded hold. That is, after driving the bottom plate of the sampling capacitor $C_{Wht}$ to various voltage levels via the common MSB reference line 42 and the switch array 48 and performing the first slope ADC operation, the voltage on sampling capacitor $C_{Wht}$ can be held, as long as the reference voltage levels are stable. Unlike a small capacitor of a typical CDAC array that can leak or change, the larger sampling capacitor $C_{Wht}$ in this approach can have a real-time low bandwidth that has a level set by the common MSB reference voltages.

Further still, unlike other approaches that utilize a DAC including an array of capacitors that each can be coupled to one positive reference voltage and one ground to generate the DAC level locally, the Slope-Slope ADC approach described above utilizes a DAC that can couple a single capacitor to one of multiple incoming reference levels ($2^N$ reference levels) where the particular reference levels are determined locally by the slope logic circuit 104 and connected via the switch array 48. This technique allows for the multiple reference levels to be shared between multiple ADCs and allows separate operations to be performed on the sampling capacitors $C_{Wht}$ and $C_{Blk}$. That is, a first slope ADC stage operation can be performed on the sampling capacitor $C_{Wht}$, e.g., to convert the MSBs, a second slope stage operation can be performed on the sampling capacitor $C_{Blk}$, e.g., to convert the LSBs, and a difference can be taken between the two sampling capacitors $C_{Wht}$ and $C_{Blk}$.

In addition, the size of the ADC circuit implemented using the techniques of this disclosure can be reduced by eliminating the array of capacitors in the DAC. A smaller ADC circuit allows an increased channel count, which can result in an increase in throughput and, therefore, an increase in image capture frame rate. These shared references may be generated by strings of resistors, with or without buffer amplifiers and decoupling, and as they are shared any trimming or optimization of these references for desired transfer function of the system is common to all converters attached to them. This can lead to economies in test and calibration.

Whether using the SAR-Slope ADC configuration of FIGS. 3-9 or the Slope-Slope ADC configuration of FIGS. 12 and 13, this disclosure describes multi-step conversion techniques in which a first conversion, e.g., coarse conversion, can determine the MSBs of a digital output corresponding to the input signal, e.g., when the positive crosses the negative in the timing diagrams, and a second conversion, e.g., fine conversion, can determine the LSBs of the digital output, e.g., when the negative crosses the positive in the timing diagrams.

After the first, e.g., coarse, conversion operation performed using the first slope ADC, the ADC circuit can hold the voltage determined to be the coarse voltage. The ADC circuit can then determine a difference between the voltages of the capacitors $C_{Wht}$ and $C_{Blk}$ plus the determined coarse voltage. Then, that sum can be converted using the second, e.g., fine, conversion operation performed using the second slope ADC.

By way of a non-limiting specific example, assume that there was 1 V on the capacitor $C_{Blk}$ and 0.5 V on the capacitor $C_{Wht}$. After the first slope ADC steps through the reference levels with respect to the voltage on the capacitor $C_{Wht}$, the switch array 48 should arrive at a voltage near 0.5 V, such as 0.52 V, for example. The voltage on the switch array, e.g., 0.52 V, is held during the second conversion because it is used for the comparison.

The voltage at the "pos" node/input of the comparator is 0.5 V+0.52 V (1.02 V) and the voltage at the "neg" node/input of the comparator is 1 V. Now, the second conversion operation begins using the second slope ADC for a fine conversion. The second slope ADC begins ramping up the voltage on the bottom plate of the capacitor $C_{Blk}$ until the voltage on the "neg" node crosses 1.02 V. Now, the held voltage of 0.52 V can be subtracted from 1.02 V, resulting in the correct value of 0.5 V that was stored on the capacitor $C_{Blk}$.

Various techniques of this disclosure adjust the voltage on the bottom plates of the capacitors $C_{Wht}$ and $C_{Blk}$, which causes the first and second conversions. In this disclosure, the terms "top plates" and "bottom plates" are used for convenience in describing the figures and are not meant to imply that there is any required spatial orientation for the capacitors.

FIG. 13 depicts another example of a circuit diagram of a slope-slope ADC circuit 120 that can resolve the MSBs using a first single-slope ADC and the LSBs using a second single-slope ADC and an associated timing diagram 121. The ADC circuit 120 can be coupled to pixel cell 32 (or "pixel"), e.g., a four-transistor pixel cell, similar to the array described above in FIG. 1. The converter 120 is similar to the converter 100 and, for purposes of conciseness, similar features will not be described in detail.

As mentioned above, in some example configurations, such as in FIG. 12, the first slope ADC circuit can proceed until the comparator 40 determines that the value of the linear ramp of the first slope ADC circuit crosses the "neg" value, which is shown at 112 in FIG. 12. Then, the comparator can latch the value at which the ramp crossed the "neg" value and the ramp can continue, e.g., until it reaches full scale.

Alternatively, as shown in FIG. 13, the ramp can stop at the crossing value, as shown at 122. Prior to or during phase "F", the second slope ADC stage, the previously applied offset (shown at 114), e.g., 0.5 MSB, can be removed, as shown in the timing diagram at 114. When the second slope ADC begins its cycles, it can start at ground and ramp up from below the position where the first slope ADC finished its operation, e.g., the value at which the comparator latched when the ramp crossed the "neg" value, without having to create a negative voltage.

The operation of the ADC circuit 120 can proceed as described above.

The techniques of this disclosure were described with respect to CIS for purpose of illustration. However, the ADC techniques of this disclosure are not limited to CIS and can be utilized with other sensors and readouts.

In addition, in some configurations, the data from the sensor, e.g., the image sensor or other sensor, can be processed by a PGA or a differencing circuit, for example, before being differenced using the techniques described in this disclosure.

Various Notes

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A method of operating a sensor circuit having a conversion circuit for performing a multi-stage conversion of a difference of two signals, the method comprising:
  receiving a first output voltage of the sensor circuit on a top plate of a first sampling capacitor of the conversion circuit;
  receiving a second output voltage of the sensor circuit on a top plate of a second sampling capacitor of the conversion circuit;
  during a first stage of the multi-stage conversion, adjusting a first voltage on the bottom plate of either the first sampling capacitor or the second sampling capacitor using a first circuit of the conversion circuit;
  during a second stage of the multi-stage conversion, adjusting a second voltage on the bottom plate of the other of the first sampling capacitor or the second sampling capacitor using a second circuit of the conversion circuit; and
  converting a difference between the first output voltage and the second output voltage by comparing the first and second output voltages on the top plates of the first and second sampling capacitors in each of the first and second stages.

2. The method of claim 1, wherein receiving the first output voltage of the sensor circuit on a top plate of the first sampling capacitor of the conversion circuit includes:
  receiving a reset voltage level of the sensor circuit on the top plate of the first sampling capacitor of the conversion circuit, and
  wherein receiving the second output voltage of the sensor circuit on the top plate of the second sampling capacitor of the conversion circuit includes:
  receiving a data voltage level of the sensor circuit on the top plate of the second sampling capacitor of the conversion circuit.

3. The method of claim 1, further comprising:
  applying an offset voltage to the bottom plate of the first sampling capacitor during the first stage of the multi-stage conversion.

4. The method of claim 1, wherein during the first stage of the multi-stage conversion, adjusting the first voltage on the bottom plate of the second sampling capacitor using the first circuit of the conversion circuit includes:
  coupling the bottom plate of the second sampling capacitor to at east one of $2^N$ voltage reference levels.

5. The method of claim 4, further comprising:
  performing a successive approximation register (SAR) operation using the first circuit.

6. The method of claim 4, further comprising:
  performing a slope ADC operation using the first circuit.

7. The method of claim 1, wherein during the second stage of the multi-stage conversion, adjusting the second voltage on the bottom plate of the first sampling capacitor using the second circuit of the conversion circuit includes:
  coupling the bottom plate of the first sampling capacitor to a ramping voltage.

8. The method of claim 7, further comprising:
  performing a slope ADC operation using the second circuit.

9. The method of claim 1, further comprising:
  after the first stage of the multi-stage conversion, holding a determined voltage using the first circuit.

10. The method of claim 1, further comprising:
  using the first circuit, generating a first conversion result representing most significant bits of a digital signal.

11. The method of claim 1, further comprising:
  pre-charging a comparator input to a trigger point voltage before connecting a comparator circuit.

12. The method of claim 1, wherein the sensor circuit includes an image sensor circuit having at least one pixel cell,
  wherein receiving the first output voltage of the sensor circuit on the top plate of the first sampling capacitor of the conversion circuit includes receiving a reset value of the at least one pixel cell, and
  wherein receiving the second output voltage of the sensor circuit on the top plate of the second sampling capacitor of the conversion circuit includes receiving an exposed value of the at least one pixel cell.

13. A circuit for performing a multi-stage conversion of a difference between two signals from a sensor circuit, the circuit comprising:
a conversion circuit configured to be coupled to an output of the sensor circuit, the conversion circuit comprising:
a first sampling capacitor having top and bottom plates, wherein the top plate of the first sampling capacitor is configured to receive a first output voltage of the sensor circuit;
a second sampling capacitor having top and bottom plates, wherein the top plate of the second sampling capacitor is configured to receive a second output voltage of the sensor circuit;
a first circuit configured to adjust a first voltage on the bottom plate of the either the first sampling capacitor or the second sampling capacitor during a first stage of the multi-stage conversion; and
a second circuit configured to adjust a second voltage on the bottom plate of the other of the first sampling capacitor or the second sampling capacitor during a second stage of the multi-stage conversion,
wherein the conversion circuit is configured to convert a difference between the first output signal and the second output signal by comparing the first and second output voltages on the top plates of the first and second sampling capacitors.

14. The circuit of claim 13, wherein the first circuit includes successive approximation register (SAR) logic circuitry.

15. The circuit of claim 13, wherein the first circuit includes slope converter circuitry.

16. The circuit of claim 13, wherein the second circuit includes slope converter circuitry.

17. The circuit of claim 13, further comprising:
a switch array configured to couple the bottom plate of the second sampling capacitor to at least one of $2^N$ voltage reference levels.

18. The circuit of claim 13, further comprising:
a switch configured to couple the bottom plate of the first sampling capacitor to a ramp voltage line.

19. The circuit of claim 13, wherein the sensor circuit includes an image sensor circuit having at least one pixel cell.

20. The circuit of claim 19, wherein the first output voltage of the sensor circuit includes a reset value of the at least one pixel cell, and wherein the second output voltage of the sensor circuit includes an exposed value of the at least one pixel cell.

21. A circuit for performing a multi-stage conversion of a difference between two signals from a sensor circuit, the circuit comprising:
means for receiving a first output voltage of the sensor circuit on a top plate of a first sampling capacitor of the conversion circuit;
means for receiving a second output voltage of the sensor circuit on a top plate of a second sampling capacitor of the conversion circuit;
during a first stage of the multi-stage conversion, means for adjusting a first voltage on the bottom plate of either the first sampling capacitor or the second sampling capacitor using a first circuit of the conversion circuit;
during a second stage of the multi-stage conversion, means for adjusting a second voltage on the bottom plate of the other of the first sampling capacitor or the second sampling capacitor using a second circuit of the conversion circuit; and means for converting a difference between the first output voltage and the second output voltage by comparing the first and second output voltages on the top plates of the first and second sampling capacitors in each of the first and second stages.

22. The circuit of claim 21, further comprising:
means for performing a successive approximation register (SAR) operation using the first circuit; and
means for performing a slope ADC operation using the second circuit.

23. The circuit of claim 21, wherein the sensor circuit includes an image sensor circuit having at least one pixel cell, wherein the first output voltage of the sensor circuit includes a reset value of the at least one pixel cell, and wherein the second output voltage of the sensor circuit includes an exposed value of the at least one pixel cell.

* * * * *

UNITED STATES PATENT AND TRADEMARK OFFICE
CERTIFICATE OF CORRECTION

PATENT NO. : 10,998,914 B2
APPLICATION NO. : 16/192400
DATED : May 4, 2021
INVENTOR(S) : Hurwitz et al.

It is certified that error appears in the above-identified patent and that said Letters Patent is hereby corrected as shown below:

In the Claims

Column 22, Line 33, Claim 4, delete "east" and insert --least-- therefor

Column 24, Line 24, Claim 21, after "and", insert a line break

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*